(12) United States Patent
Kathirgamanathan et al.

(10) Patent No.: US 7,303,824 B2
(45) Date of Patent: Dec. 4, 2007

(54) ELECTROLUMINESCENT DEVICE

(75) Inventors: Poopathy Kathirgamanathan, North Harrow (GB); Lisa Marie Bushby, London (GB); Richard David Price, London (GB)

(73) Assignee: OLED-T Limited, Enfield (GB)

( * ) Notice: Subject to any disclaimer, the term of this patent is extended or adjusted under 35 U.S.C. 154(b) by 373 days.

(21) Appl. No.: 10/485,781

(22) PCT Filed: Aug. 5, 2002

(86) PCT No.: PCT/GB02/03588

§ 371 (c)(1),
(2), (4) Date: Apr. 19, 2004

(87) PCT Pub. No.: WO03/014256

PCT Pub. Date: Feb. 20, 2003

(65) Prior Publication Data

US 2004/0253477 A1  Dec. 16, 2004

(30) Foreign Application Priority Data

| Aug. 4, 2001 | (GB) | ................................. | 0119109.7 |
| Aug. 4, 2001 | (GB) | ................................. | 0119112.1 |
| Aug. 4, 2001 | (GB) | ................................. | 0119116.2 |

(51) Int. Cl.
*H01L 51/54* (2006.01)
*C09K 11/06* (2006.01)

(52) U.S. Cl. ...................... 428/690; 428/917; 313/504; 313/506; 257/40; 257/E51.041; 257/E51.043; 257/E51.044

(58) Field of Classification Search .................... None
See application file for complete search history.

(56) References Cited

U.S. PATENT DOCUMENTS

| 4,356,429 | A | 10/1982 | Tang |
| 4,455,364 | A | 6/1984 | Sasa |
| 4,720,432 | A | 1/1988 | VanSlyke et al. |
| 4,885,211 | A | 12/1989 | Tang et al. |
| 5,128,587 | A | 7/1992 | Skotheim et al. |
| 5,281,489 | A | 1/1994 | Mori et al. |
| 5,755,999 | A | 5/1998 | Shi et al. |
| 5,757,026 | A | 5/1998 | Forrest et al. |
| 5,807,627 | A | 9/1998 | Friend et al. |
| 6,153,726 | A | 11/2000 | Kathirgamanathan et al. |
| 6,294,273 | B1 | 9/2001 | Heuer et al. |
| 7,074,505 | B2 * | 7/2006 | Grushin et al. ............. 428/690 |
| 7,087,323 | B2 * | 8/2006 | Grushin et al. ............. 428/690 |
| 2003/0144487 | A1 * | 7/2003 | Grushin et al. ............... 534/15 |
| 2003/0215669 | A1 * | 11/2003 | Kathirgamanathan et al. .......... 428/690 |
| 2004/0023061 | A1 * | 2/2004 | Kathirgamanathan et al. .......... 428/690 |
| 2004/0023062 | A1 * | 2/2004 | Kathirgamanathan et al. .......... 428/690 |
| 2004/0137264 | A1 * | 7/2004 | Kathirgamanathan et al. .......... 428/690 |

FOREIGN PATENT DOCUMENTS

| EP | 0 087 309 A | 8/1983 |
| EP | 0 278 629 A | 8/1988 |
| EP | 1-282291 | 11/1989 |
| EP | 0 461 542 A | 12/1991 |
| EP | 0 556 005 A | 8/1993 |
| EP | 0 569 827 A | 11/1993 |
| EP | 0 744 451 A | 11/1996 |
| EP | 0 936 844 A | 8/1998 |
| EP | 0 964 459 | 12/1999 |
| EP | 1 026 222 | 8/2000 |
| EP | 1 052 661 | 11/2000 |
| JP | 61037887 | 2/1986 |
| JP | 1-256584 | 10/1989 |
| JP | 06 145146 A | 5/1994 |
| WO | WO 90/13148 | 11/1990 |
| WO | WO 92/03490 | 3/1992 |
| WO | WO 98/02018 | 1/1998 |
| WO | WO 98/55561 | 12/1998 |
| WO | WO 98/58037 | 12/1998 |
| WO | WO 00/26323 | 5/2000 |
| WO | WO 00/32717 | 6/2000 |
| WO | WO 00/32718 | 6/2000 |
| WO | WO 00/32719 | 6/2000 |
| WO | WO 00/44851 | 8/2000 |
| WO | WO 02/43444 | 5/2002 |
| WO | WO 02/43446 | 5/2002 |
| WO | WO 02/43447 | 5/2002 |
| WO | WO 02/086014 | 10/2002 |
| WO | WO 02/086015 | 10/2002 |
| WO | WO 02/087283 | 10/2002 |
| WO | WO 02/087288 | 10/2002 |
| WO | WO 02/090465 | 11/2002 |
| WO | WO 02/090466 | 11/2002 |
| WO | WO 02/091493 | 11/2002 |
| WO | WO 02/102924 | 12/2002 |
| WO | WO 03/006573 | 1/2003 |
| WO | WO 03/014256 | 2/2003 |

OTHER PUBLICATIONS

U.S. Appl. No. 60/303,283 (Jul. 5, 2001).*
Y. Hamada, et al., Blue Electroluminescence in Thin Films of Azomethin-Zinc Complexes, Japanese Journal of Applied Physics, vol. 32, Apr. 1, 1993, No. 4A, pp. L511-L513.

(Continued)

*Primary Examiner*—Marie Yamnitzky
(74) *Attorney, Agent, or Firm*—David Silverstein; Andover-IP-Law

(57) ABSTRACT

An electroluminescent device which has an electroluminescent layer formed of a binuclear, trinuclear or polynuclear rare earth organic complex in which the metals are linked through a bridging ligand.

12 Claims, 23 Drawing Sheets

OTHER PUBLICATIONS

M. Berggren, et al., Ultraviolet Electroluminescence from an Organic Light Emitting Diode, Advance Materials, 7 (1995), Nov. No. 11; pp. 900-903.

N. Armaroli, Luminescence properties of Eu3+, Tb3-, and GD3+ complexes of the hexadentate N-donor podand tris-[3-(2-pyridyl) pyrazol-lyl] hydroborate, Chemical Physics Letters 276, Sep. 26, 1997, pp. 435-440.

N.C. Greenham, et al., Measurement of absolute photoluminescence quantum efficiencies in conjugated polymers, Chemical Physics Letters, Jul. 1995, 241, pp. 89-96.

L. Liu, et al., Europium complexes as emitters in organic electroluminescent devices, Synthetic Metals 91, 1997, pp. 267-269.

S. Dirr, et al., Luminescence enhancement in microcavity organic multilayer structures, Synthetic Metals, 9, 1997, pp. 53-56.

J. Kido, et al., White-Light Emitting Organic Electroluminescent Device Using Lanhanide Complexes, Japanese Journal of Applied Physics No. 35, 1996, pp. L304-L396.

K. Hensen, et al. Darstellung Von N-BZW. O-Chlormethylsilyl-Derivaten der Armine 1,2,3,4-Tetrahydro-1, 10-Phenanthrolin und 8-Hydroxychinolin, J. of Organometallic Chemistry, 209, 1981, pp. 17-23.

J. Kido, et al. Organic Electroluminescent Devices Using Lanthanide Complexes; Department of Materials Science and Engineering, 1995, Yamagata University, Yamagata Japan, pp. 110-111, source not given.

C.J. Kepert, et al., Structural Systematics of Rare Earth Complexes; V+ The Hydrated 1:1 Adducts of 2,2':6'2"-Terpyrid wiht Lanthanoid (III) Chlorides, Australisan Journal of Chemistry, 1994,, 47, pp. 365-384.

K. Machida, et al., Redox Behavior and Luminescence Property of Europium Polymer Complexes, Department of Applied Chemistry, Faculty of Engineering, Osaka University, Osaka, Japan 1991, pp. 70-71, source not given.

K. Hayashi, et al., Syntheses and Structural Studies of Lanthanide Mixed Ligand Complexes containing B-diketone, Department of Chemistry, Faculty of Science, Ochanomizu University, Tokyo, Japan, 1996, pp. 210-211, source not given.

K. Tsuchiya, et al., Complex Formation and Its High Dispersion in the Simultaneous Vacuum Deposition of Copper and Phthalocyanine, Faculty of Engineering, Yamagata University, Yonezawa, Japan, 1998, pp. 149-154, source not given.

L. K. Templeton, et al., Anomalous Scattering by Praseodymium, Samarium and Gadolinium and Structures of their Ethylenediaminetetraacetate (edta) Salts, Acta. Cryst. (1982), B38, pp. 2155-2159.

J. Kido, et al., Bright red light-emitting organic electroluminescent devices having a europium complex as an emitter, Applied Physics Letters, 65 (17), Oct. 1994, pp. 2124-2126.

T. Wakimoto, et al., Organic EL cells with high luminous efficiency, Applied Science 113/114 (1997) pp. 698-704.

J. Kido, et al., Electroluminescence in a Terbium Complex, Chemistry Letters, The Chemistry Society of Japan, 1990, pp. 657-660.

J. Kido, et al., Multilayer White Light-Emitting Organic Electroluminescent Device, Science, vol. 267, Mar. 1995, pp. 1332-1334.

H. Spreitzer, et al., Soluble Phenyl-Substituted PPVs-New Materials for Highly Efficient Polymer LEDs, Advanced Materials, 10 (1998), No. 16, pp. 1340-1343.

C. C. Wu, et al., Poly(p-phenylene vinylene)/tris(8-hydroxy) quinoline aluminum heterostructure light emitting diode, 320 Applied Physics Letters 66 (1995) Feb. No. 6, Woodbury, NY, US, pp. 653-655.

A.G. MacDiarmid and A.J. Epstein: "Polyanilines: A Novel Class of Conducting Polymers" Faraday Discussions, Chem.Soc. 88, 317-331, 1989.

S.R. Drake et al.: "Lanthanide B-Diketonate Glyme Complexes exhibiting Unusual Co-ordination Modes" J.Chem.Soc. Dalton Trans 1993, 2379-2386.

S.R. Drake et al.: "An Unexpected Product Derived from the Reation of . . . " Inorg. Chem. 1994, 33, 1230-1233.

Yong Cui et al.: "Synthesis, characterization and X-ray structure of three types of . . . complexes" POLYHEDRON 20 (2001), 1795-1802.

S. Fery-Forgues and B. Delavaux-Nicot.: "Ferrocene and ferrocenyl derivatives in luminescent systems" J. Photochemistry and Photobiology A: Chemistry 132 (2000) 137-159.

C.D. Hall, N.W. Sharpe: "Photophys. and Photochem. Studies on Lanthanide Complexes of Metallocene-Containing Cryptands" J. Photochem. and Photobio. A: Chem 56 (1991), 255-265.

* cited by examiner m= 0,1,2 etc.
n= 0,1,2 etc.

n = 0,1,2 etc.

m= 0,1,2 etc.
m= 0,1,2 etc.

Alq

Bebq

BAlq1

ZnPBO

ZnPBT

DTVb1

EDTA

DCTA

DTPA

TTHA or

α-NPB

TPD mTADATA

Rare-Earth chelate bis-phosphane oxide complexes

Rare-Earth chelate tris-phosphane oxide complexes

Rare-Earth chelate bis-phosphinimino-phosphane oxide complexes

ELECTROLUMINESCENT DEVICE

The present invention relates to electroluminescent devices incorporating electroluminescent materials.

Materials which emit light when an electric current is passed through them are well known and used in a wide range of display applications. Liquid crystal devices and devices which are based on inorganic semiconductor systems are widely used, however these suffer from the disadvantages of high energy consumption, high cost of manufacture, low quantum efficiency and the inability to make flat panel displays.

Organic polymers have been proposed as useful in electroluminescent devices, but it is not possible to obtain pure colours, they are expensive to make and have a relatively low efficiency.

Another compound which has been proposed is aluminium quinolate, but this requires dopants to be used to obtain a range of colours and has a relatively low efficiency.

Patent application WO98/58037 describes a range of lanthanide complexes which can be used in electroluminescent devices which have improved properties and give better results. Patent Applications PCT/GB98/01773, PCT/GB99/03619, PCT/GB99/04030, PCT/GB99/04024, PCT/GB99/04028, PCT/GB00/00268 describe electroluminescent complexes, structures and devices using rare earth chelates.

We have now devised electroluminescent devices incorporating other organometallic electroluminescent materials.

DETAILED DESCRIPTION OF PREFERRED EMBODIMENTS

According to the invention there is provided an electroluminescent device which comprises sequentially a first electrode, a layer of an electroluminescent compound and second electrode in which the electroluminescent compound is selected from binuclear, trinuclear and polynuclear complexes of rare earth metals.

By binuclear is meant that there are least two metal atoms in the complex, at least one of which is a rare earth metal the other metals can be a rare earth or non rare earth metal one in which the metals are linked by a bridging ligand i.e. of formula

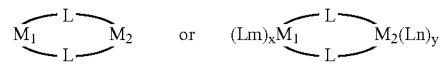

where $M_1$ is a rare earth metal and $M_2$ is a rare earth or non rare earth metal Lm and Ln are the same or different organic ligands, x is the valence state of Lm and y is the valence state of Ln and L is a bridging ligand. For example x will be 3 when $M_1$ is in the III valence state and y will be 2 when $M_2$ and is in the 2 valence state etc.

By trinuclear is meant there are three metals joined by a bridging ligand one of which metals is a rare earth metal and at least one of which is a non rare earth metal i.e. of formula

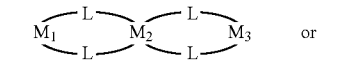

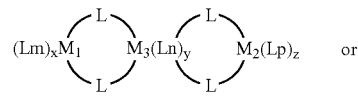

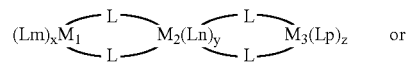

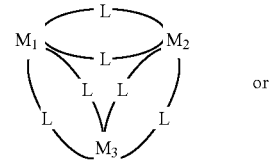

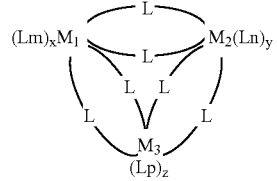

where L is a bridging ligand and at least one of $M_1$, $M_2$ and $M_3$ is a rare earth metal and the other metals can be a rare earth or non rare earth metals. Lm, Ln and Lp are organic ligands and x is the valence state of $M_1$, y is the valence state of $M_2$ and z is the valence state of $M_3$ By polynuclear is meant there are more than three metals joined by bridging ligands and at least one of the metals is a rare earth metal and the other metals can be a rare earth or non rare earth metal.

Preferably the rare earth metal is a metal having an unfilled inner shell and the preferred metals are selected from Sm(III), Eu(II), Eu(III), Tb(III), Dy(III), Yb(III), Lu(III), Gd (III), Gd(III) U(III), Tm(III), Ce (III), Pr(III), Nd(III), Pm(III), Dy(III), Ho(III), Er(III), Yb(III) and more preferably Eu(III), Tb(III), Dy(III), Gd (III).

The non rare earth metal can be any non rare earth metal e.g. lithium, sodium, potassium, rubidium, caesium, beryllium, magnesium, calcium, strontium, barium, copper, silver, gold, zinc, cadmium, boron, aluminium, gallium, indium, germanium, tin, antimony, lead, and metals of the fist, second and third groups of transition metals e.g. manganese, iron, ruthenium, osmium, cobalt, nickel, palladium, platinum, cadmium, chromium, titanium, vanadium, zirconium, tantalum, molybdenum, rhodium, iridium, titanium, niobium, scandium, yttrium etc.

For example $(L_1)(L_2)(L_3)(L \ldots )M_1\text{-}L\text{-}M_2(L_1)(L_2)(L_3)(L \ldots )$ where $(L_1)(L_2)(L_3)(L \ldots )$ are the same or different organic complexes.

For example x will be 3 when $M_1$ is in the III valence state and y will be 2 when $M_2$ and is in the 2 valence sate.

The bridging ligands L are preferably bidentate or tridentate ligands and are preferably bis or tris phosphane oxide complexes e.g. of formula

Figure 17:
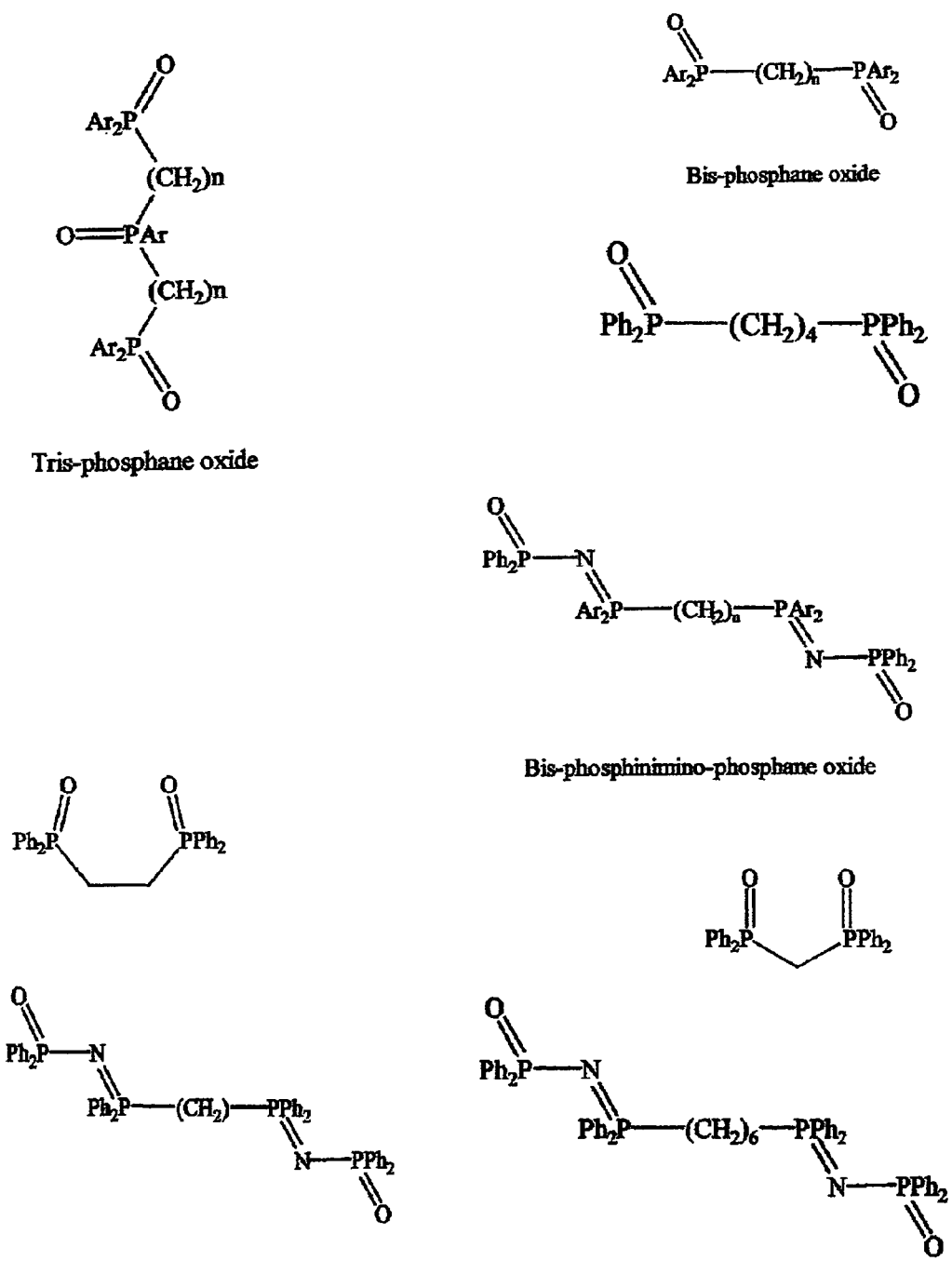
FIG. 17 shows additional bridging ligands for bridging the metal atoms in the electroluminescent materials of this invention.

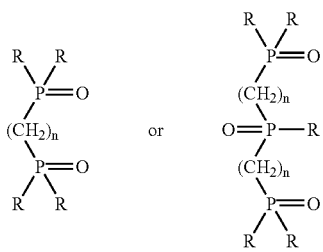

where the groups R which can be the same or different are selected from hydrogen, and substituted and unsubstituted hydrocarbyl groups such as substituted and unsubstituted aliphatic groups, substituted and unsubstituted aromatic, heterocyclic and polycyclic ring structures, fluorocarbons such as trifluoryl methyl groups, halogens such as fluorine or thiophenyl groups, n is preferably 1 to 10 e.g. 1 to 5 or as shown in FIG. 17 of the drawings in which Ar are the same or different unsubstituted or substituted aromatic groups.

Or bis(diphenylphosphinimino-phosphane oxides e.g. of formula

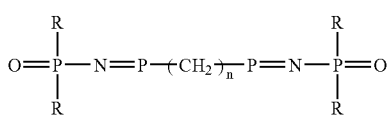

where R and n are as above. Preferably the groups R are unsubstituted or substituted aromatic groups or as shown in FIG. 17.

Examples of other ligands are also shown in FIG. 17 of the drawings

The groups Lm, Ln, Lp etc. which can also be the bridging ligands may all be the same or different and can be selected from β diketones such as those of formulae

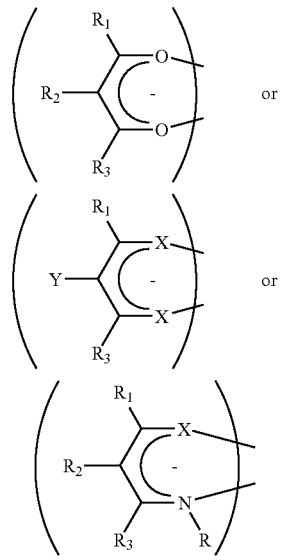

where $R_1$, $R_2$ and $R_3$ can be the same or different and are selected from hydrogen, and substituted and unsubstituted hydrocarbyl groups such as substituted and unsubstituted aliphatic groups, substituted and unsubstituted aromatic, heterocyclic and polycyclic ring structures, fluorocarbons such as trifluoryl methyl groups, halogens such as fluorine or thiophenyl groups; $R_1$, $R_2$ and $R_3$ can also form substituted and unsubstituted fused aromatic, heterocyclic and polycyclic ring structures and can be copolymerisable with a monomer e.g. styrene. X is Se, S or O, Y can be hydrogen, substituted or unsubstituted hydrocarbyl groups, such as substituted and unsubstituted aromatic, heterocyclic and polycyclic ring structures, fluorine, fluorocarbons such as trifluoryl methyl groups, halogens such as fluorine or thiophenyl groups or nitrile.

Examples of $R_1$ and/or $R_2$ and/or $R_3$ include aliphatic, aromatic and heterocyclic alkoxy, aryloxy and carboxy groups, substituted and substituted phenyl, fluorophenyl, biphenyl, phenanthrene, anthracene, naphthyl and fluorene groups alkyl groups such as t-butyl heterocyclic groups such as carbazole.

$R_1$, $R_2$ and $R_3$ can also be

where X is O, S, Se or NH.

A preferred moiety $R_1$ is trifluoromethyl $CF_3$ and examples of such diketones are, banzoyltrifluoroacetone, p-chlorobenzoyltrifluoroacetone, p-bromotrifluoroacetone, p-phenyltrifluoroacetone, 1-naphthoyltrifluoroacetone, 2-naphthoyltrifluoroacetone, 2-phenathoyltrifluoroacetone, 3-phenanthoyltrifluoroacetone, 9-anthroyltrifluoroacetonetrifluoroacetone, cinnamoyltrifluoroacetone, and 2-thenoyltrifluoroacetone.

The different groups Lm, Ln and Lp may be the same or different ligands of formulae

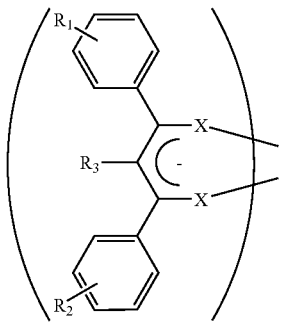

where X is O, S, or Se and $R_1$ $R_2$ and $R_3$ are as above

The different groups Lm, Ln and Lp may be the same or different quinolate derivatives such as

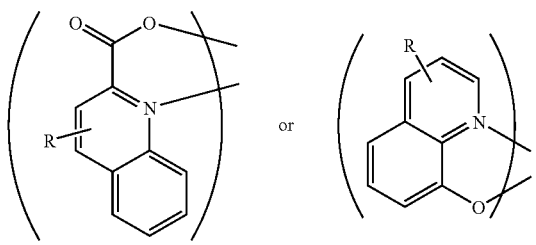

where R is hydrocarbyl, aliphatic, aromatic or heterocyclic carboxy, aryloxy, hydroxy or alkoxy e.g. the 8 hydroxy quinolate derivatives or

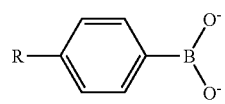

where R is as above or H or F or

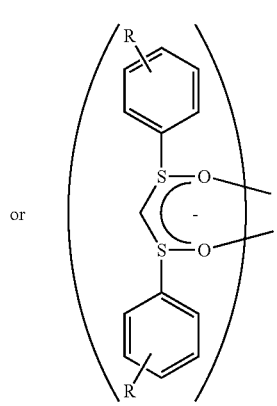

The different groups Lm, Ln and Lp may also be the same or different carboxylate groups

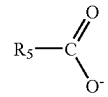

where $R_5$ is a substituted or unsubstituted aromatic, polycyclic or heterocyclic ring a polypyridyl group, $R_5$ can also be a 2-ethyl hexyl group so Ln is 2-ethylhexanoate or $R_5$ can be a chair structure so that Ln is 2-acetyl cyclohexanoate or L can be

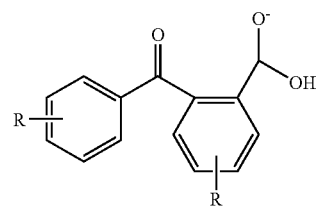

where R is as above e.g. alkyl, allenyl, amino or a fused ring such as a cyclic or polycyclic ring.

The different groups Lm, Ln and Lp may also be

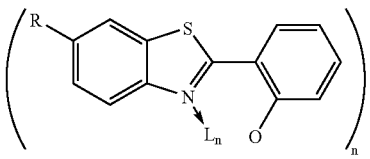

Large or complex molecular structures can be used in which a "cage" or "basket" structure is formed by the ligands Lm and Ln and Lp being condensed together and/or the metal atoms being linked by a hero atom or atoms such as oxygen, nitrogen etc.

For example the groups R, $R_1$, $R_2$ and $R_3$ on the ligands Lm and the groups R, $R_1$, $R_2$ and $R_3$ on the ligands Ln can form a condensed or ring structure e.g. substituted and unsubstituted fused aromatic, heterocyclic and polycyclic ring structures Examples of such complexes are described in Chem. Abs. Vol 106 page 568, J. Chem Soc. Dalton Trans 1993 pps 2379 to 2386 and in Inorg. Chem. 1994, 33, 1230-1233;

Optionally there can also be a neutral ligand Lq linked to the metal $M_1$ and/or $M_2$ The groups Lq can be selected from

Figure 1:
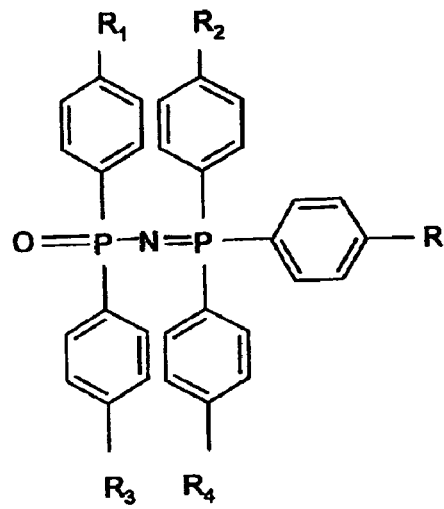
FIGS. 1, 2a-2b and 3 show ligands for bridging the metal atoms in the electroluminescent materials of this invention.
Figure 2A:
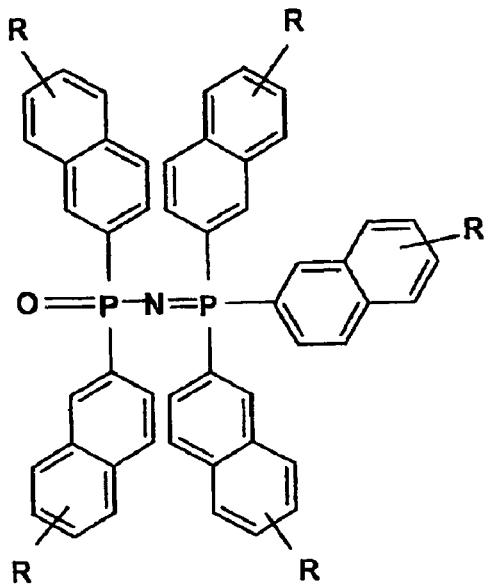
Figure 2B:
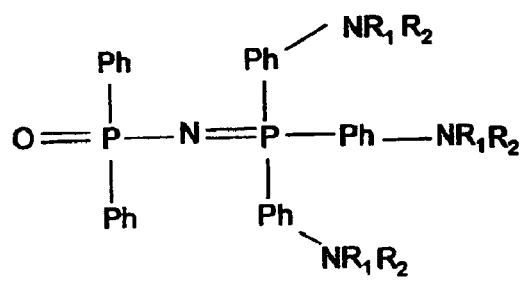

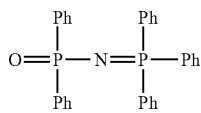

Where each Ph which can be the same or different and can be a phenyl (OPNP) or a substituted phenyl group, other substituted or unsubstituted aromatic group, a substituted or unsubstituted heterocyclic or polyclic group, a substituted or unsubstituted fused aromatic group such as a naphthyl, anthracene, phenanthrene, prylene or pyrene group. The substituents can be an alkyl, aralkyl, alkoxy, aromatic, heterocyclic, polyclic group, and halogen such as fluorine. Examples are given in FIGS. 1 and 2 of the drawings where R, $R_1$, $R_2$, $R_4$ and $R_5$ can be the same or different and are selected from hydrogen, hydrocarbyl groups, substituted and unsubstituted aromatic, heterocyclic and polycyclic ring structures, fluorocarbons such as trifluoryl methyl groups, halogens such as fluorine or thiophenyl groups; R, $R_1$, $R_2$, $R_4$ and $R_5$ can also be copolymerisable with a monomer e.g. styrene. R, $R_1$, $R_2$, $R_3$ and $R_4$ can also be unsaturated alkylene groups such as vinyl groups or groups

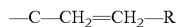

where R is as above.

Lq can also be compounds of formulae

Figure 3:
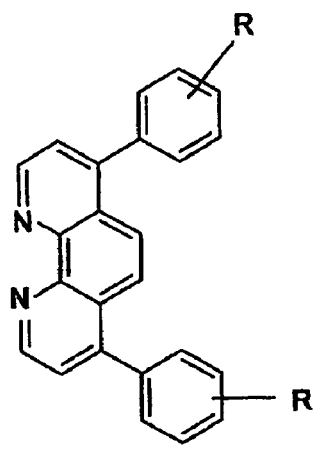
Figure 4A:
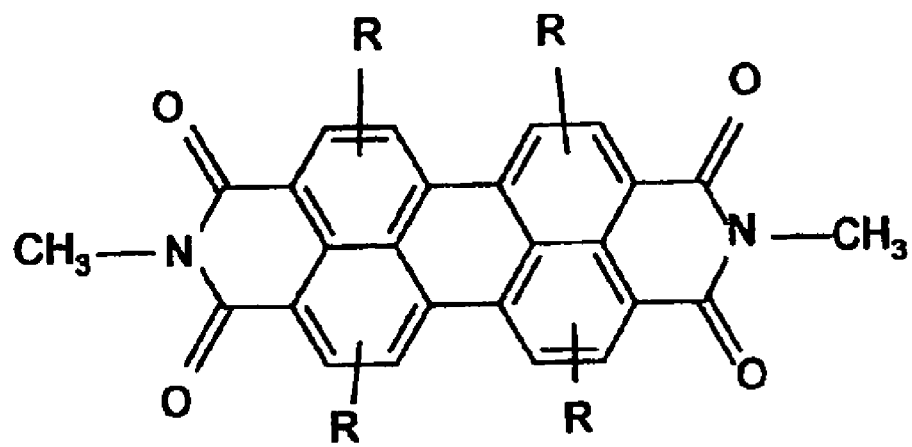
FIGS. 4a-4l show additional ligands for bridging the metal atoms in the electroluminescent materials of this invention.
Figure 4B:
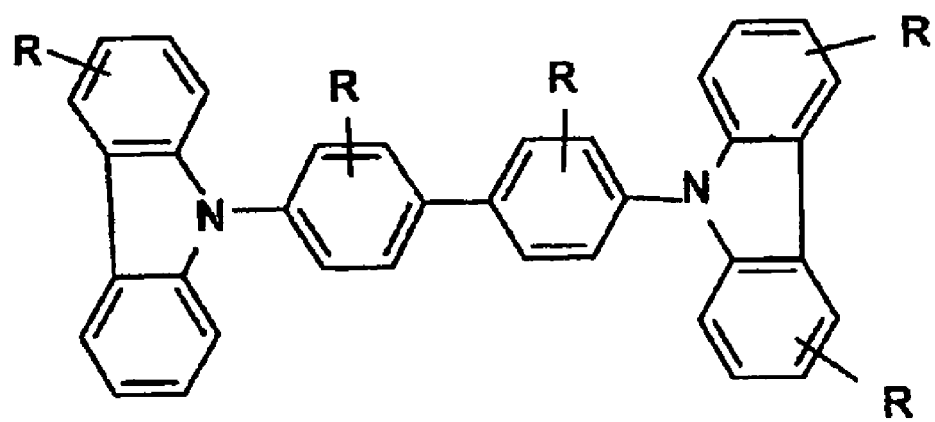
Figure 4C:
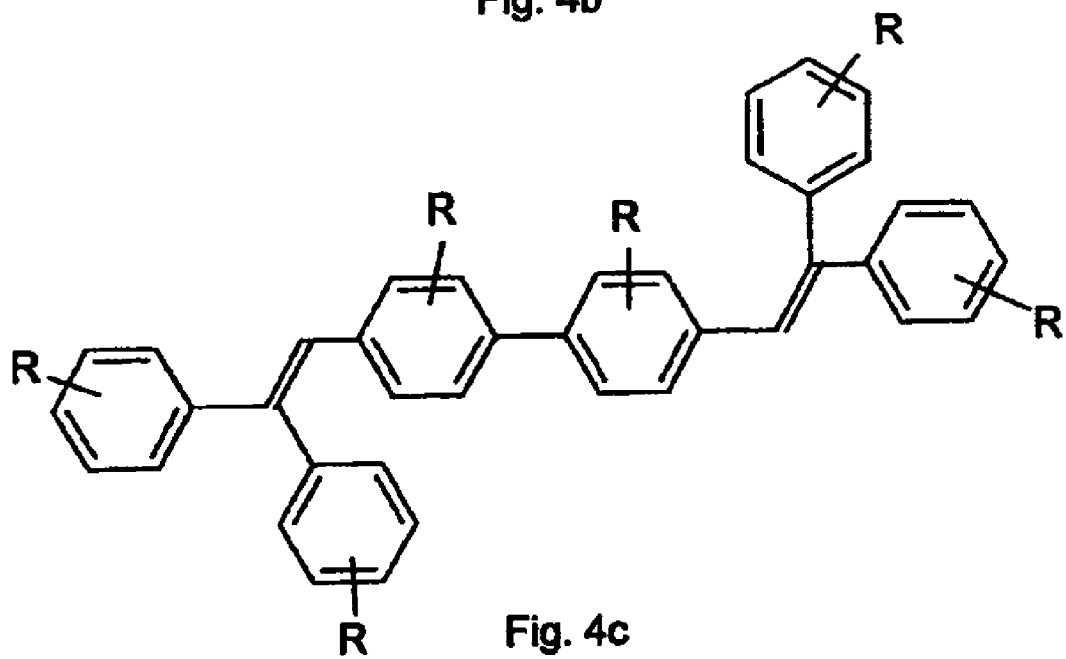
Figure 4D:
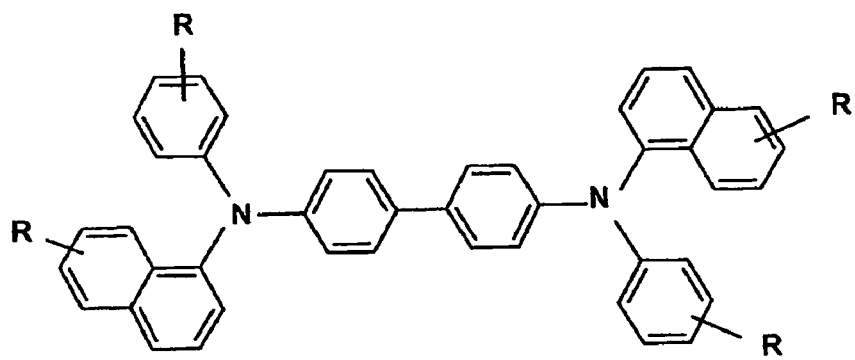
Figure 4E:
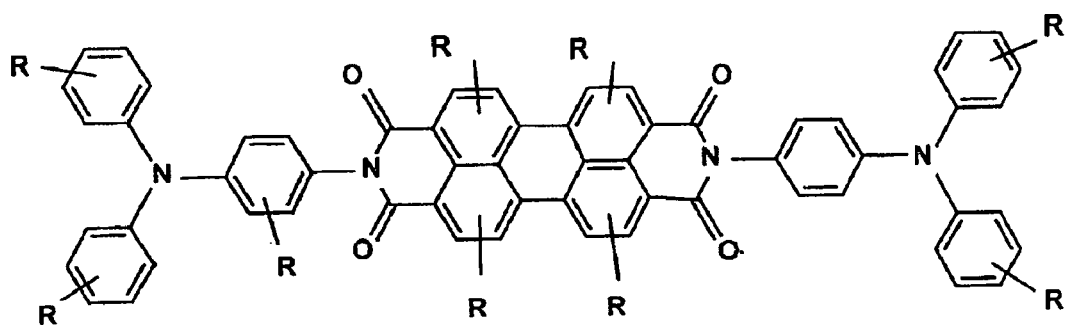
Figure 4F:
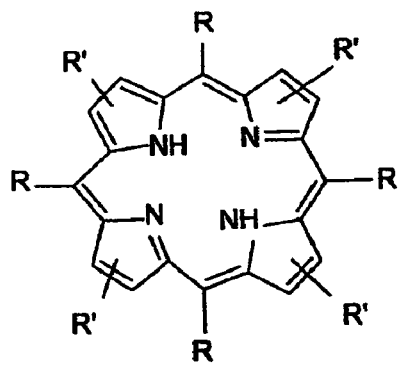
Figure 4G:
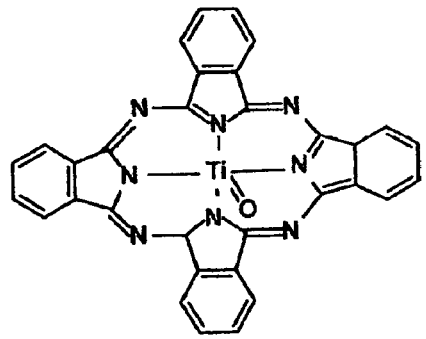
Figure 4H:
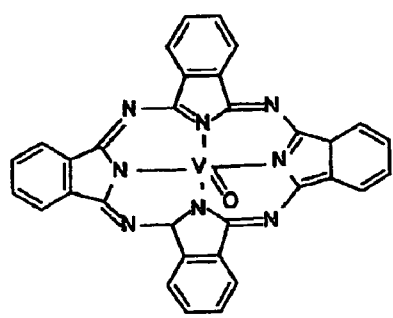
Figure 4I:
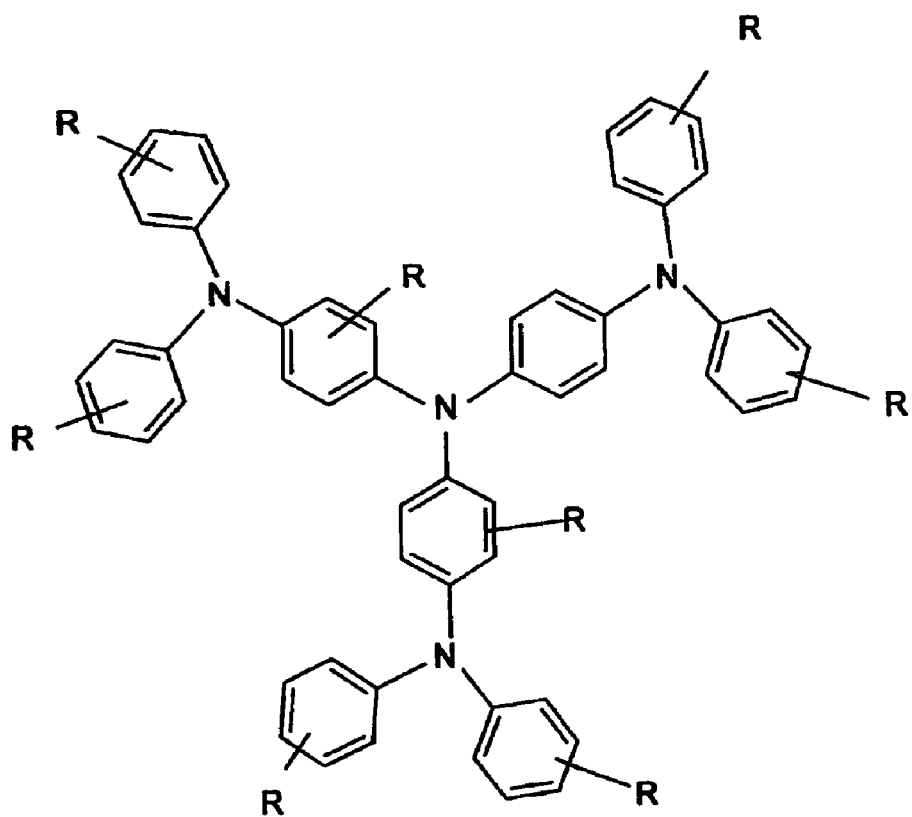
Figure 4J:
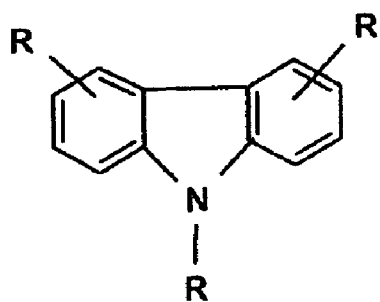
Figures 4K, 4L:
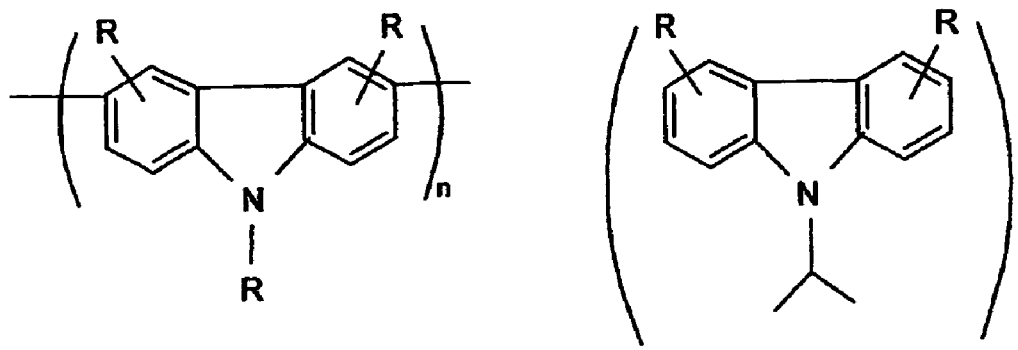
Figure 5A:
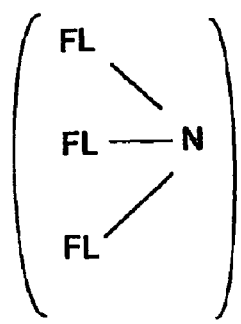
FIGS. 5a-5f, 6a-6e, 7a-7f and 8a-8h show further ligands for bridging the metal atoms in the electroluminescent materials of this invention.
Figure 5B:
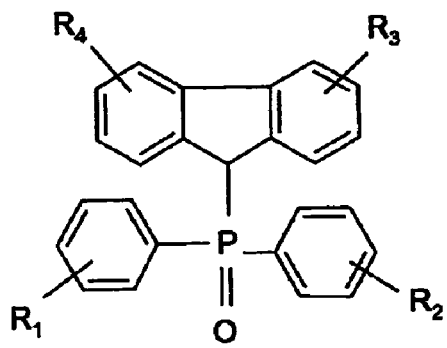
Figure 5C:
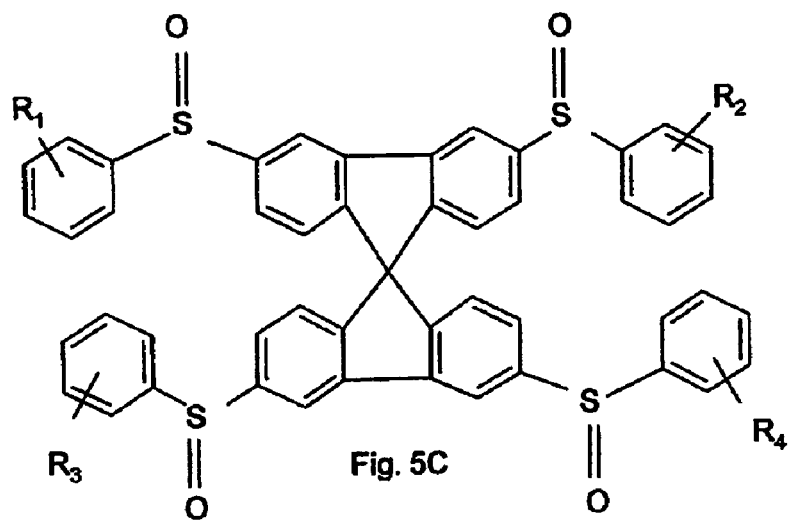
Figure 5D:
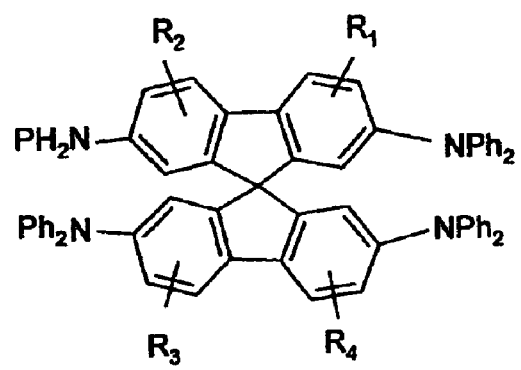
Figure 5E:
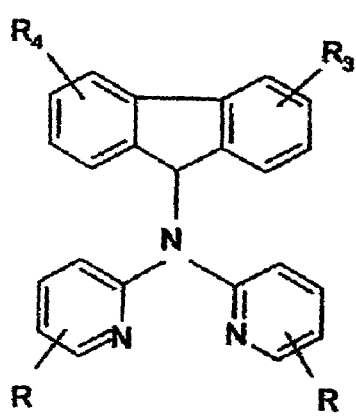
Figure 5F:
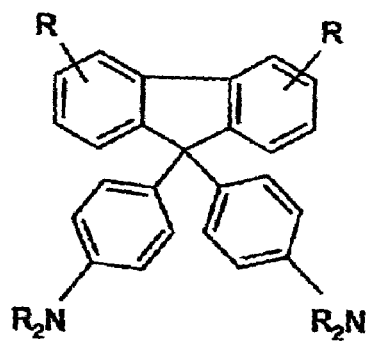
Figure 6A:
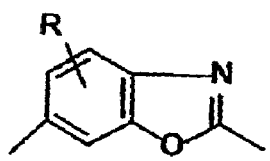
Figure 6B:
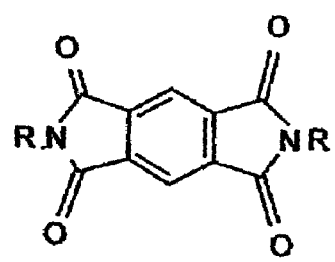
Figure 6C:
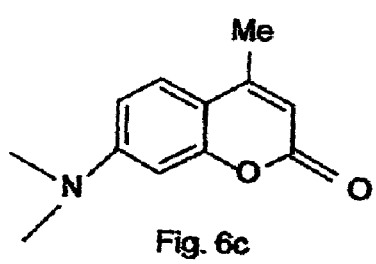
Figure 6D:
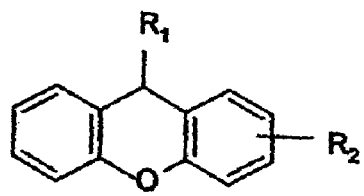
Figure 6E:
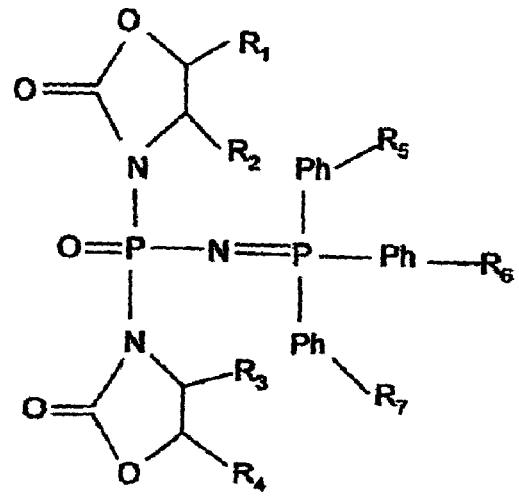
Figure 7A:
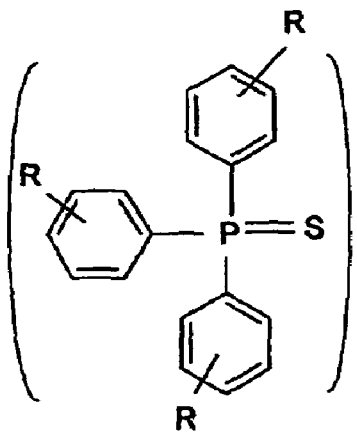
Figure 7B:
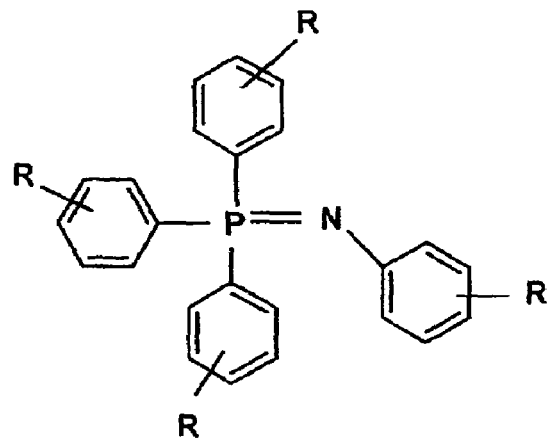
Figure 7C:
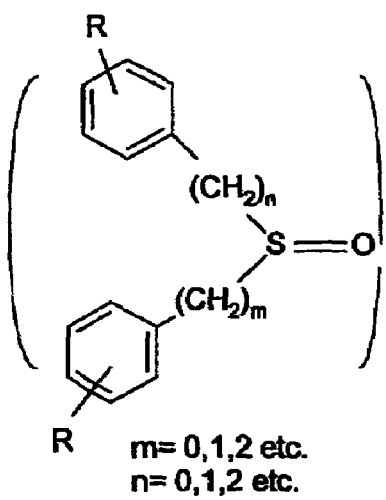
Figure 7D:
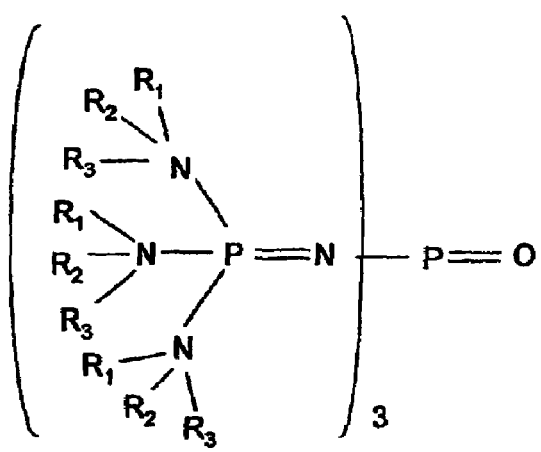
Figure 7E:
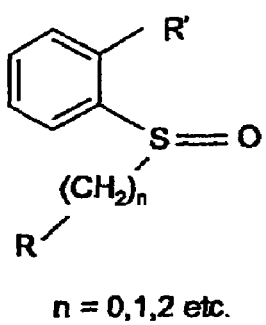
Figure 7F:
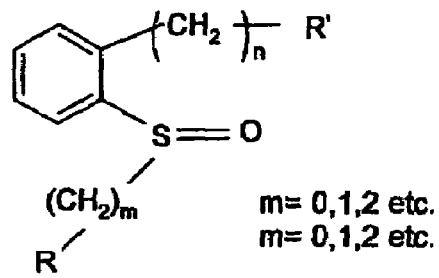
Figure 8A:
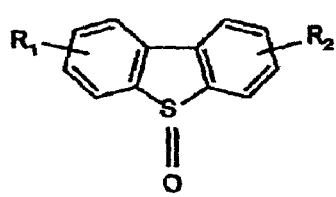
Figure 8B:
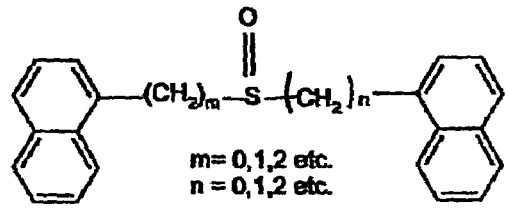
Figure 8C:
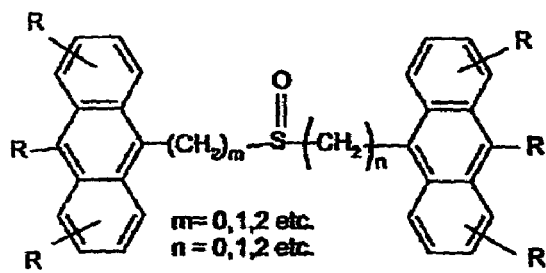
Figure 8D:
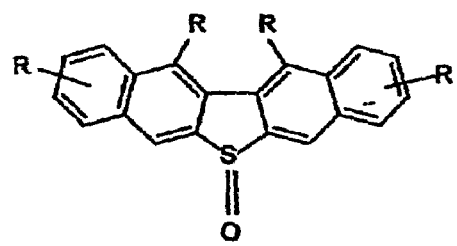
Figure 8E:
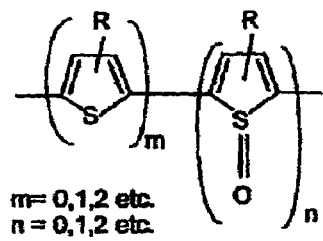
Figure 8F:
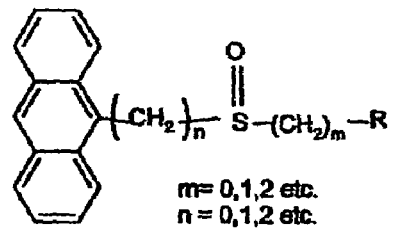
Figure 8G:
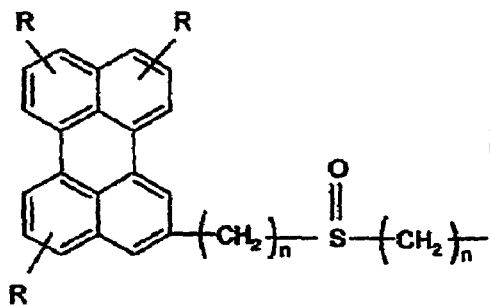
Figure 8H:
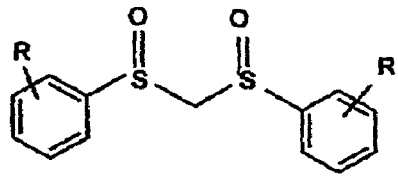

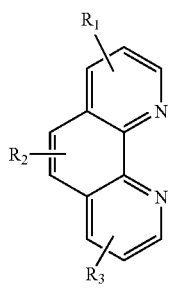

where $R_1$, $R_2$ and $R_3$ are as referred to above, for example bathophen shown in FIG. 3 of the drawings.

Lq can also be

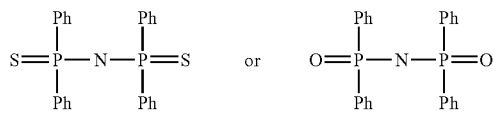

where Ph is as above.

Other examples of Lq chelates are as shown in FIGS. 4a to 4l and fluorene and fluorine derivatives e.g., as shown in FIGS. 5a to 5f and compounds of formulae as shown as shown in FIGS. 6a to 6e, 7a to 7f and 8a to 8h.

Specific examples of Lq are tripyridyl and TMBD, and TMHD complexes, α, α', α" tripyridyl, crown ethers, cyclans, cryptans phthalocyanans, porphoryins ethylene diamine tetramine (EDTA), DCTA, DTPA and TTHA. Where TMHD is 2,2,6,6-tetramethyl-3,5-heptanedionato and OPNP is diphenylphosphonimide triphenyl phosphorane.

Figure 18:
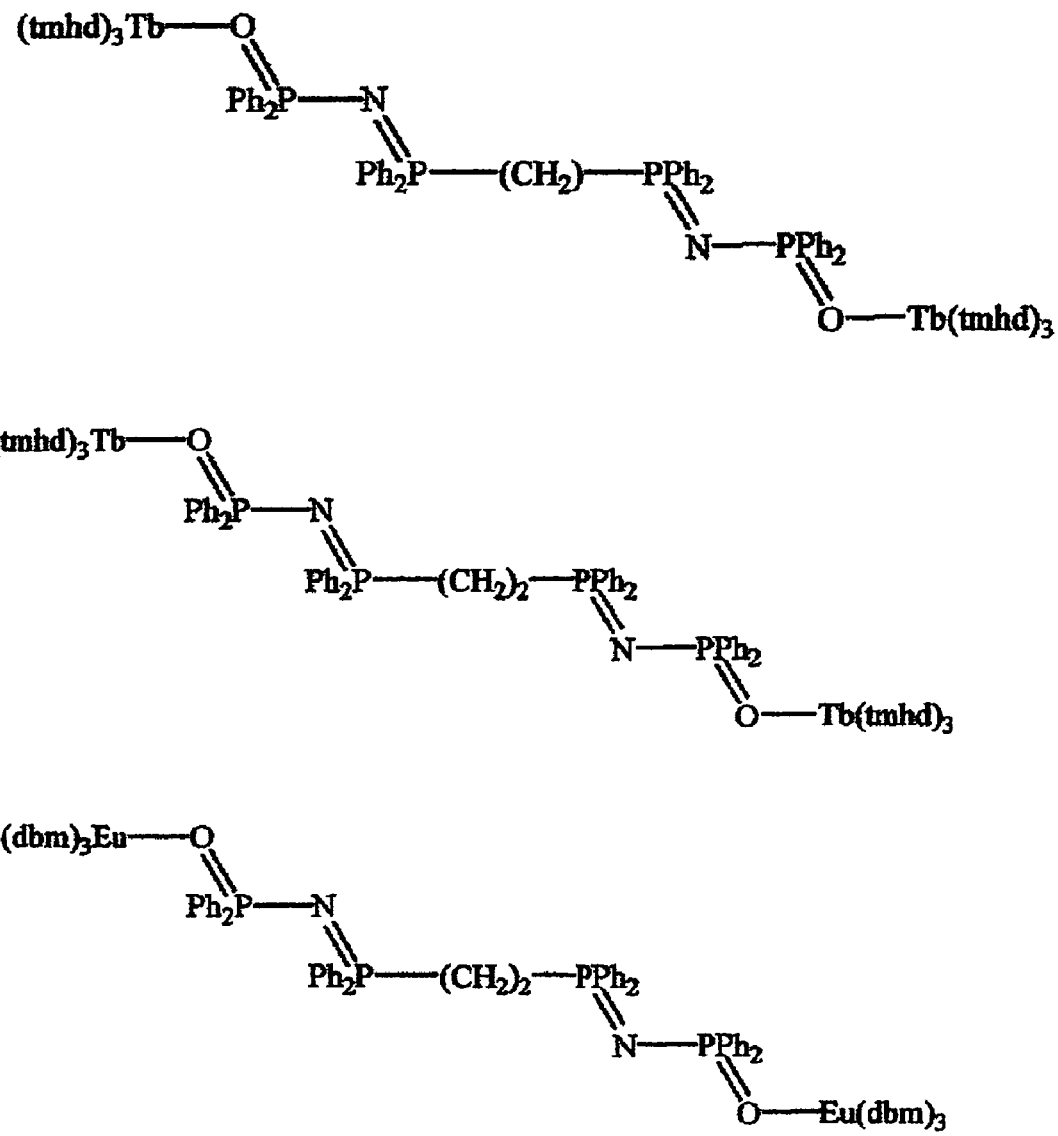
FIG. 18 shows binuclear complexes useful as electroluminescent compounds in accordance with this invention.
Figure 19A:
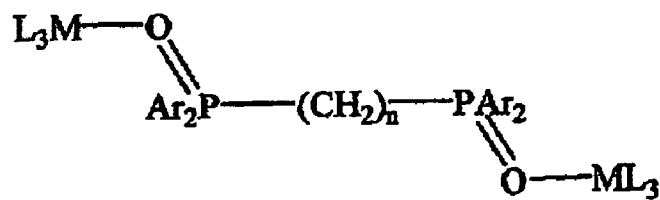
FIGS. 19a-19c show generic formulae of further binuclear and tri-nuclear complexes which are useful as electroluminescent compounds in accordance with this invention, these complexes illustrating the rare earth chelate bis-phosphate oxide complexes, rare earth chelate tris-phosphine oxide complexes and rare earth chelate bis phosphin-imino-phosphane oxide complexes which are within the scope of this invention.
Figure 19B:
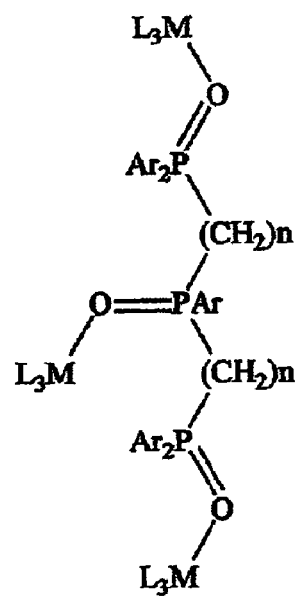
Figure 19C:
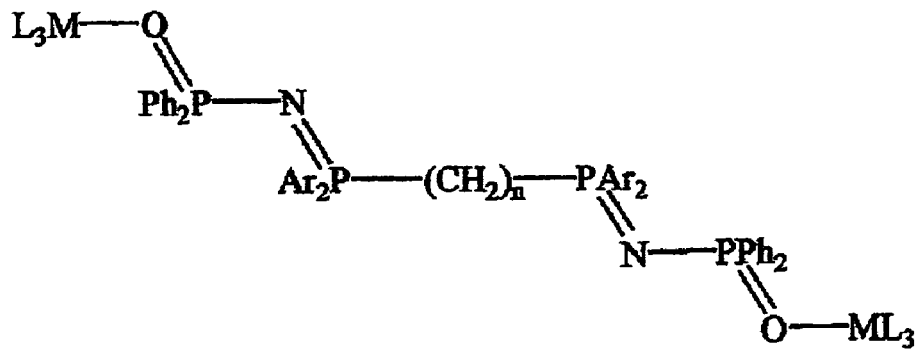
Figure 20:
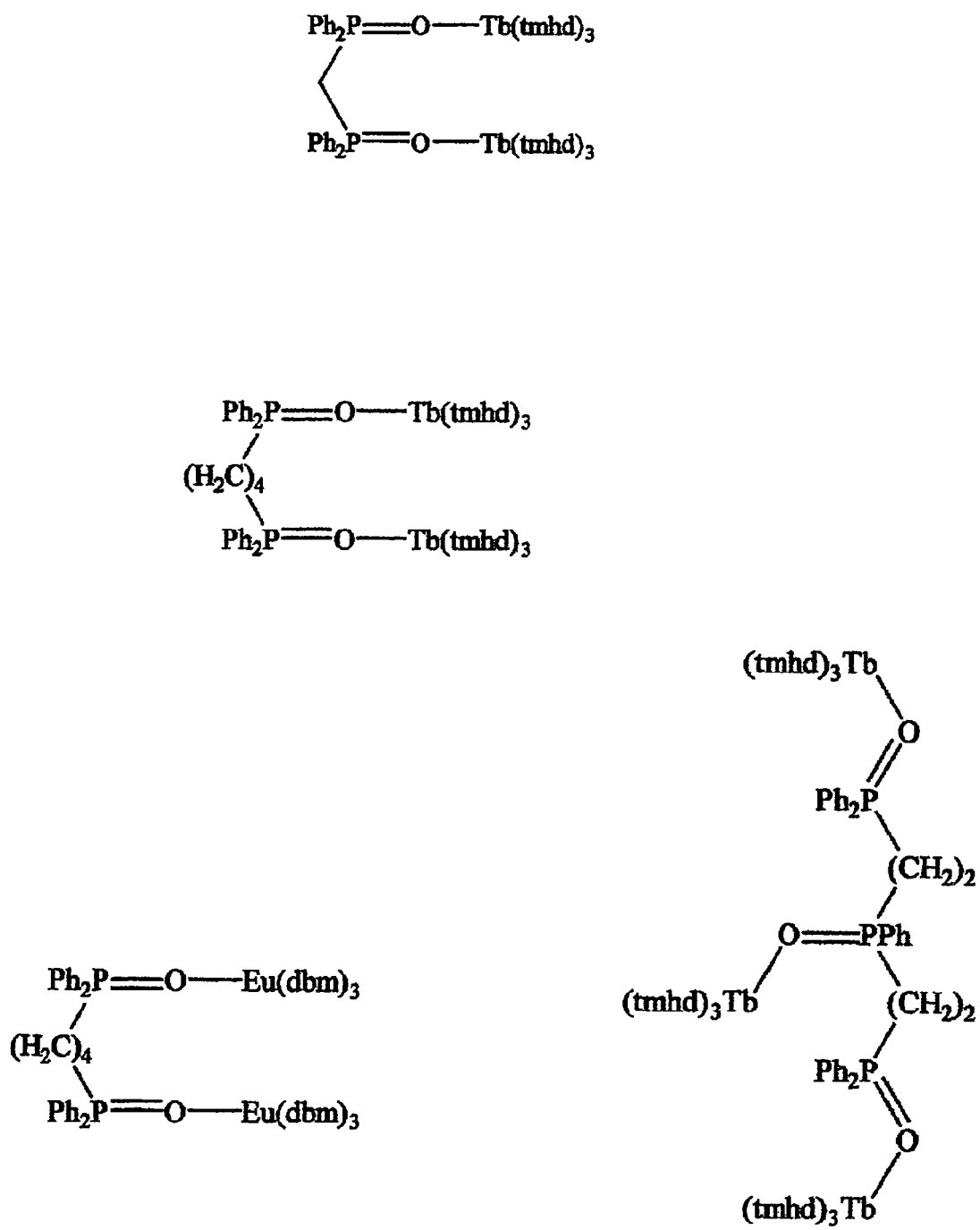
FIG. 20 shows the formulae of some binuclear and tri-nuclear compounds of terbium and europium which are useful as electroluminescent compounds in accordance with this invention.

Preferred complexes of the present invention are shown in FIGS. 18, 19 and 20 of the drawings where $L_3$ are the ligands Lm, Ln or Lp.

The first electrode is preferably a transparent substrate which is a conductive glass or plastic material which acts as the anode, preferred substrates are conductive glasses such as indium tin oxide coated glass, but any glass which is conductive or has a conductive layer can be used. Conductive polymers and conductive polymer coated glass or plastics materials can also be used as the substrate.

Preferably there is a layer of a hole transporting material between the first electrode and the layer of the electroluminescent material.

The hole transporting material can be an amine complex such as poly (vinylcarbazole), N,N'-diphenyl-N,N'-bis (3-methylphenyl)-1,1'-biphenyl 4,4'-diamine (TPD), an unsubstituted or substituted polymer of an amino substituted aromatic compound, a polyaniline, substituted polyanilines, polythiophenes, substituted polythiophenes, polysilanes etc. Examples of polyanilines are polymers of

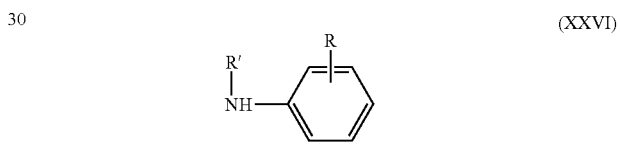

(XXVI)

where R is in the ortho—or meta-position and is hydrogen, C1-18 alkyl, C1-6 alkoxy, amino, chloro, bromo, hydroxy or the group

where R is alky or aryl and R' is hydrogen, C1-6 alkyl or aryl with at least one other monomer of formula I above.

Or the hole transporting material can be a polyaniline, polyanilines which can be used in the present invention have the general formula

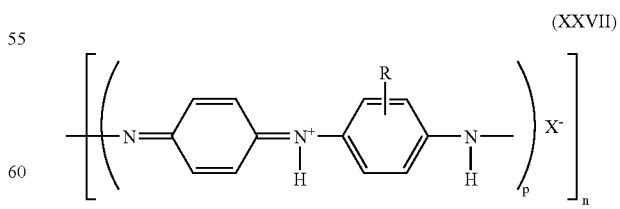

(XXVII)

where p is from 1 to 10 and n is from 1 to 20, R is as defined above and X is an anion, preferably selected from Cl Br, $SO_4$, $BF_4$, $PF_6$, $H_2PO_3$, $H_2PO_4$, arylsulphonate, arenedicarboxylate, polystyrenesulphonate, polyacrylate alkysulphonate, vinylsulphonate, vinylbenzene sulphonate, cellulose sulphonate, camphor sulphonates, cellulose sulphate or a perfluorinated polyanion.

Examples of arylsulphonates are p-toluenesulphonate, benzesulphonate, 9,10-anthraquinone-sulphonate and anthracenesulphorate, an example of an arenedicarboxylate is phthalate and an example of arenecarboxylate is benzoate.

We have found that protonated polymers of the unsubstituted or substituted polymer of an amino substituted aromatic compound such as a polyaniline are difficult to evaporate or cannot be evaporated, however we have surprisingly found that if the unsubstituted or substituted polymer of an amino substituted aromatic compound is deprotonated the it can be easily evaporated i.e. the polymer is evaporable.

Preferably evaporable deprotonated polymers of unsubstituted or substituted polymer of an amino substituted aromatic compound are used. The de-protonated unsubstituted or substituted polymer of an amino substituted aromatic compound can be formed by deprotonating the polymer by treatment with an alkali such as ammonium hydroxide or an alkali metal hydroxide such as sodium hydroxide or potassium hydroxide.

The degree of protonation can be controlled by forming a protonated polyaniline and de-protonating. Methods of preparing polyanilines are described in the article by A. G. MacDiarmid and A. F. Epstein, Faraday Discussions, Chem Soc. 88 P319 1989.

The conductivity of the polyaniline is dependant on the degree of protonation with the maximum conductivity being when the degree of protonation is between 40 and 60% e.g. about 50% for example.

Preferably the polymer is substantially fully deprotonated

A polyaniline can be formed of octamer units i.e. p is four e.g.

ferred polymers are poly(2,5 dialkoxyphenylene vinylene) such as poly (2-methoxy-5-2-methoxypentyloxy-1,4-phenylene vinylene), poly(2-methoxypentyloxy)-1,4-phenylenevinylene), poly(2-methoxy-5-(2-dodecyloxy-1,4-phenylenevinylene) and other poly(2,5 dialkoxyphenylenevinylenes) with at least one of the alkoxy groups being a long chain solubilising alkoxy group, poly fluorenes and oligofluorenes, polyphenylenes and oligophenylenes, polyanthracenes and oligo anthracenes, ploythiophenes and oligothiophenes.

In PPV the phenylene ring may optionally carry one or more substituents e.g. each independently selected from allyl, preferably methyl, alkoxy, preferably methoxy or ethoxy.

Any poly(arylenevinylene) including substituted derivatives thereof can be used and the phenylene ring in poly(p-phenylenevinylene) may be replaced by a fused ring system such as anthracene or naphthlyene ring and the number of vinylene groups in each polyphenylenevinylene moiety can be increased e.g. up to 7 or higher.

The conjugated polymers can be made by the methods disclosed in U.S. Pat. No. 5,807,627, PCT/WO90/13148 and PCT/WO92/03490.

The thickness of the hole transporting layer is preferably 20 nm to 200 nm.

The polymers of an amino substituted aromatic compound such as polyanilines referred to above can also be used as buffer layers with or in conjunction with other hole transporting materials.

The structural formulae of some other hole transporting materials are shown in FIGS. 11, 12 and 13 to 16 of the drawings, where $R_1$, $R_2$ and $R_3$ can be the same or different and are selected from hydrogen, and substituted and unsubstituted hydrocarbyl groups such as substituted and unsub-

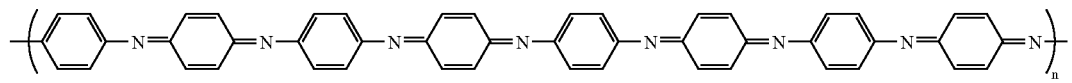

This is referred to as DDPANI

The polyanilines can have conductivities of the order of $1 \times 10^{-1}$ Siemen $cm^{-1}$ or higher.

The aromatic rings can be unsubstituted or substituted e.g. by a C1 to 20 alkyl group such as ethyl.

The polyaniline can be a copolymer of aniline and preferred copolymers are the copolymers of aniline with o-anisidine, m-sulphanilic acid or o-aminophenol, or o-toluidine with o-aminophenol, o-ethylaniline, o-phenylene diamine or with amino anthracenes.

Other polymers of an amino substituted aromatic compound which can be used include substituted or unsubstituted polyaminonapthalenes, polyaminoanthracenes, polyaminophenanthrenes, etc. and polymers of any other condensed polyaromatic compound. Polyaminoantacenes and methods of make them are disclosed in U.S. Pat. No. 6,153,726. The aromatic rings can be unsubstituted or substituted e.g. by a group R as defined above, Other hole transporting materials are conjugated polymer and the conjugated polymers which can be used can be any of the conjugated polymers disclosed or referred to in U.S. Pat. No. 5,807,627, PCT/WO90/13148 and PCT/WO92/03490.

The preferred conjugated polymers are poly (p-phenylenevinylene)-PPV and copolymers including PPV. Other prestituted aliphatic groups, substituted and unsubstituted aromatic, heterocyclic and polycyclic ring structures, fluorocarbons such as trifluoryl methyl groups, halogens such as fluorine or thiophenyl groups; $R_1$, $R_2$ and $R_3$ can also form substituted and unsubstituted fused aromatic, heterocyclic and polycyclic ring structures and can be copolymerisable with a monomer e.g. styrene. X is Se, S or O, Y can be hydrogen, substituted or unsubstituted hydrocarbyl groups, such as substituted and unsubstituted aromatic, heterocyclic and polycyclic ring structures, fluorine, fluorocarbons such as trifluoryl methyl groups, halogens such as fluorine or thiophenyl groups or nitrile.

Examples of $R_1$ and/or $R_2$ and/or $R_3$ include aliphatic, aromatic and heterocyclic alkoxy, aryloxy and caboxy groups, substituted and substituted phenyl fluorophenyl, biphenyl, phenanthrene, anthracene, naphthyl and fluorene groups alkyl groups such as t-butyl, heterocyclic groups such as carbazole.

Figure 9:
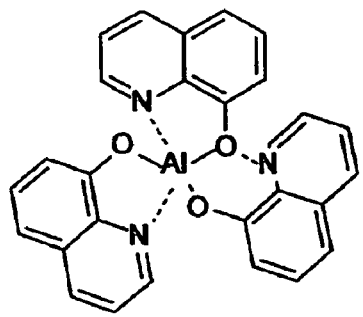
FIGS. 9 and 10 show electron transporting compounds used in the electroluminescent devices of this invention.
Figure 9:
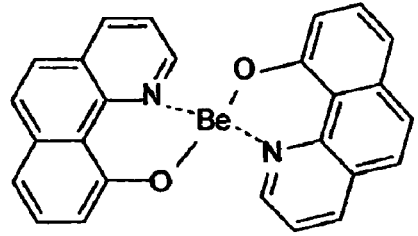
Figure 9:
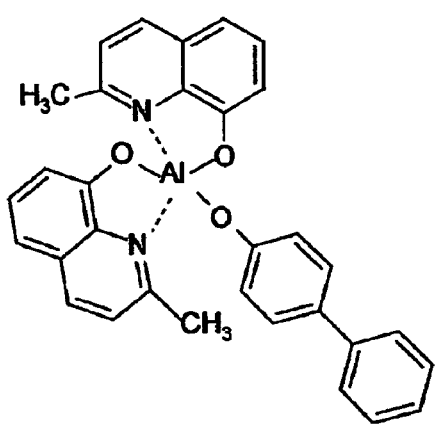
Figure 9:
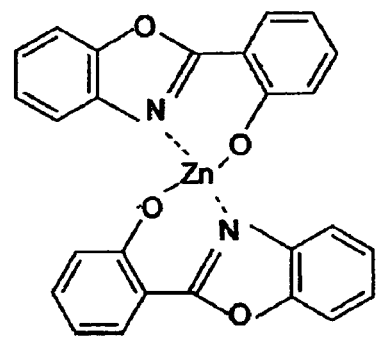
Figure 9:
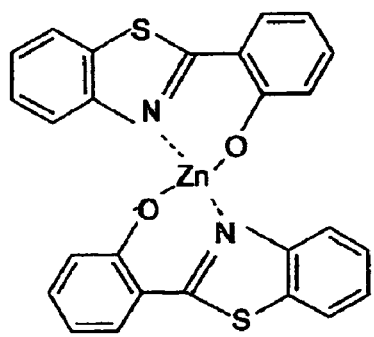
Figure 9:
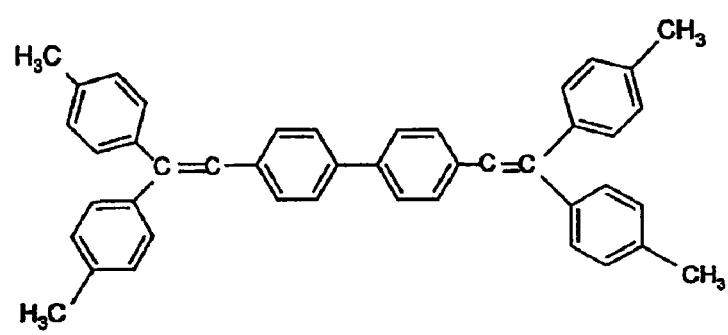
Figure 10:
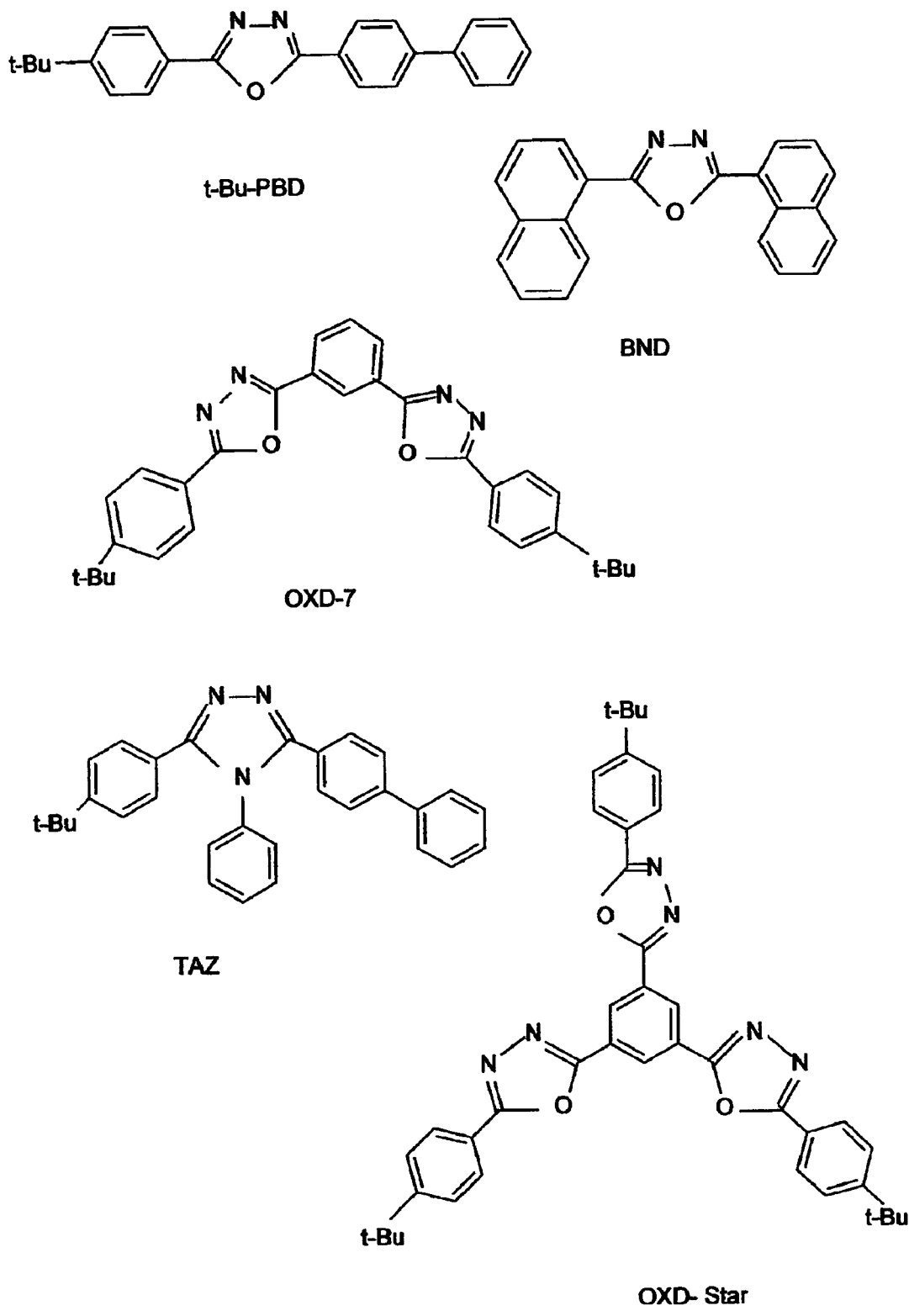
Figure 11:
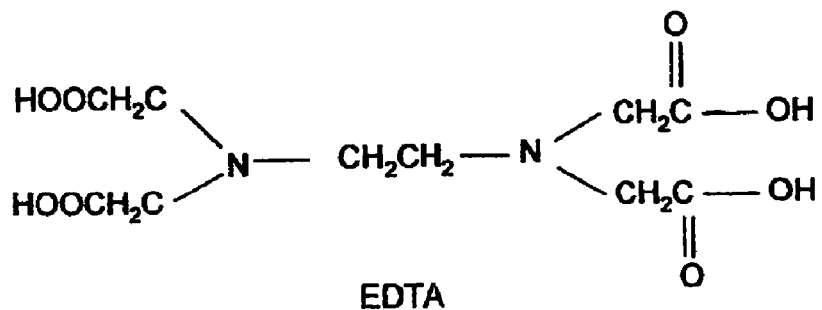
FIGS. 11, 12a-12d, 13a-13c, 14a-14d, 15a-15b, and 16a-16c show hole transporting materials used in the electroluminescent devices of this invention.
Figure 11:
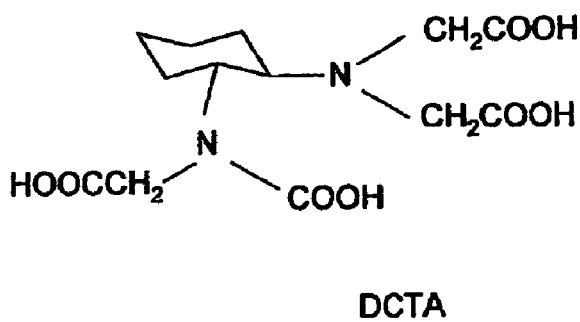
Figure 11:
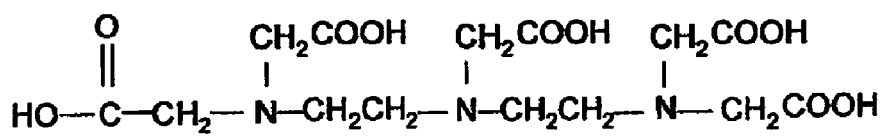
Figure 11:
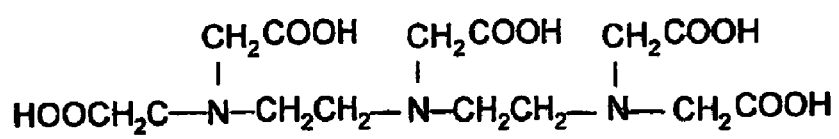
Figure 12A:
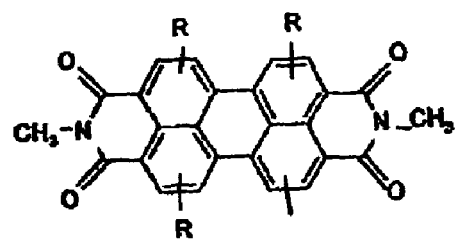
Figure 12B:
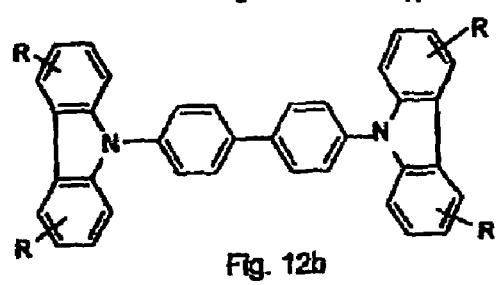
Figure 12C:
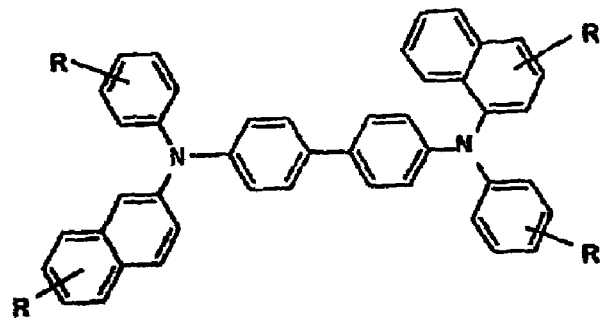
Figure 12D:
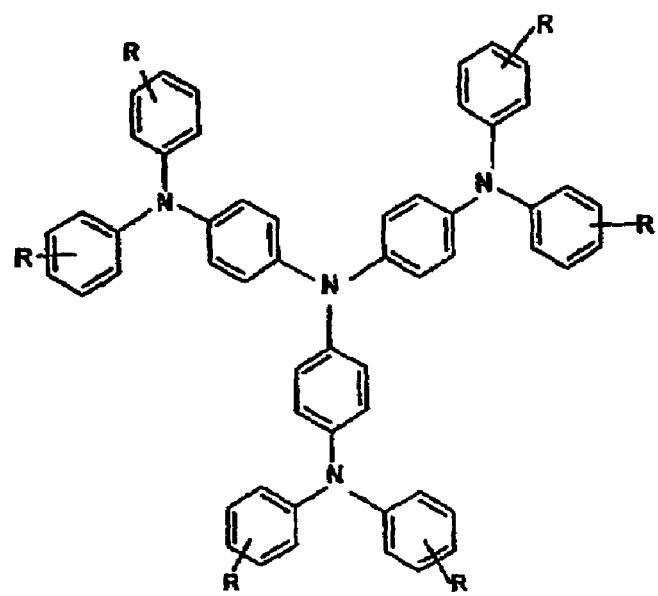
Figure 13A:
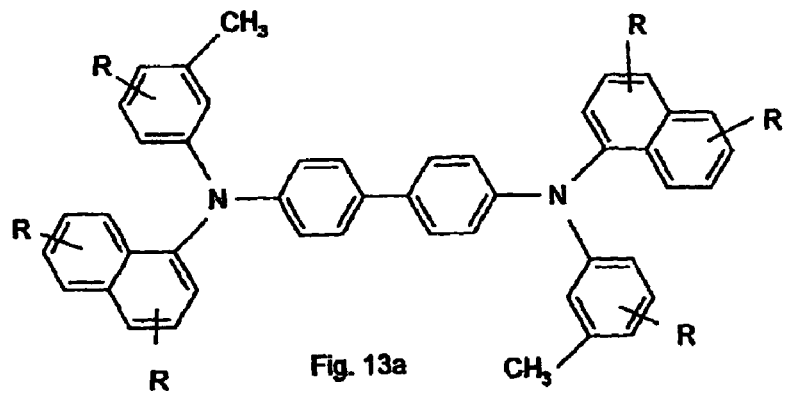
Figure 13B:
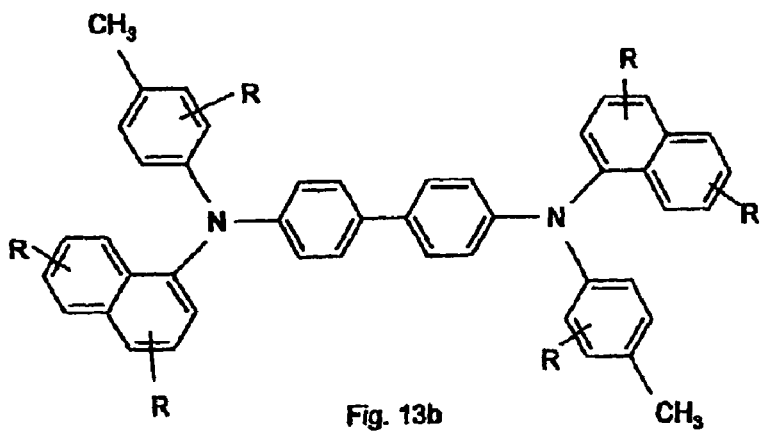
Figure 13C:
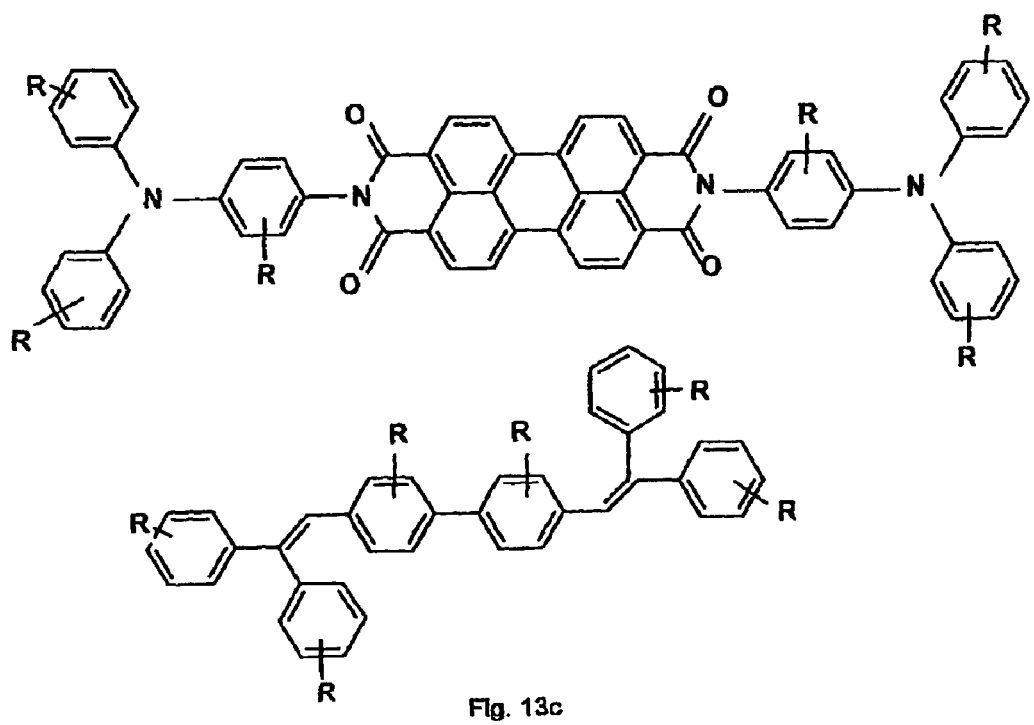
Figure 14A:
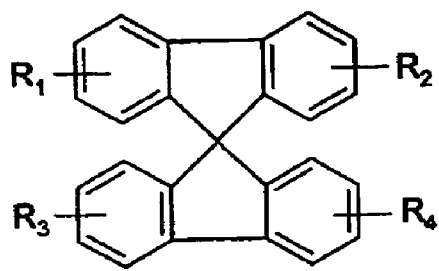
Figure 14B:
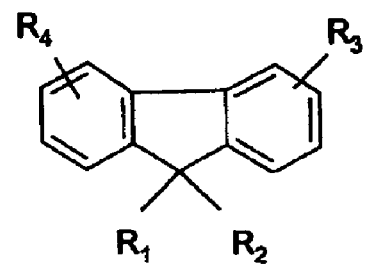
Figure 14C:
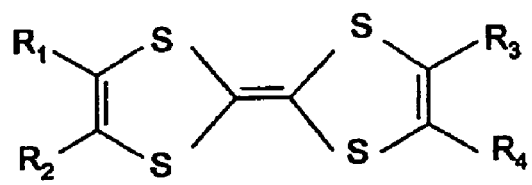
Figure 14C:
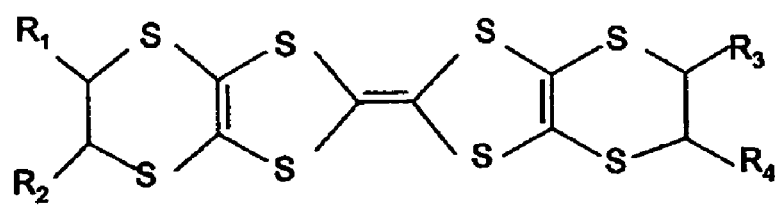
Figure 14D:
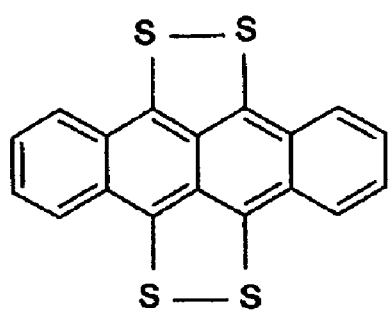
Figure 15A:
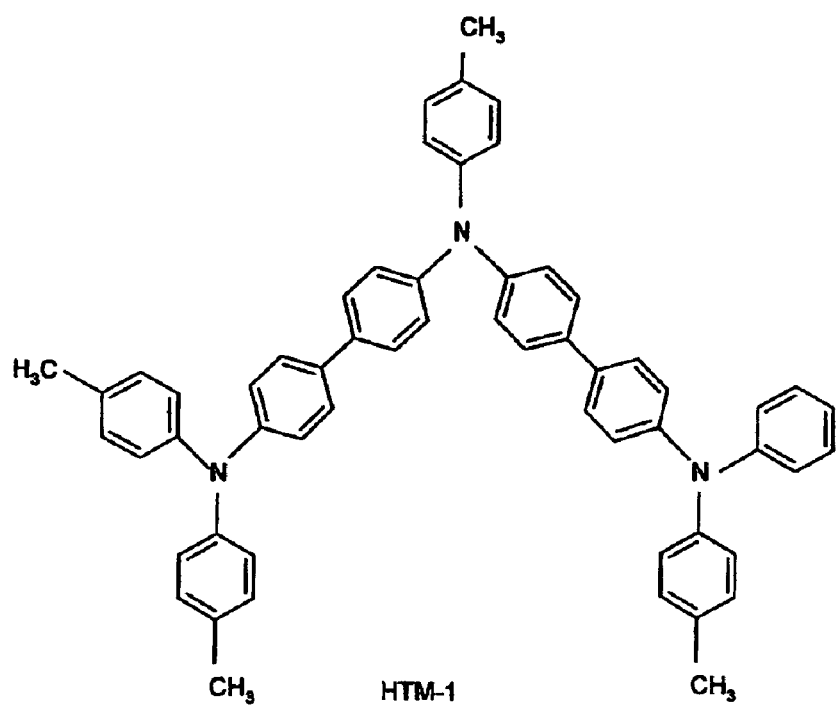
Figure 15B:
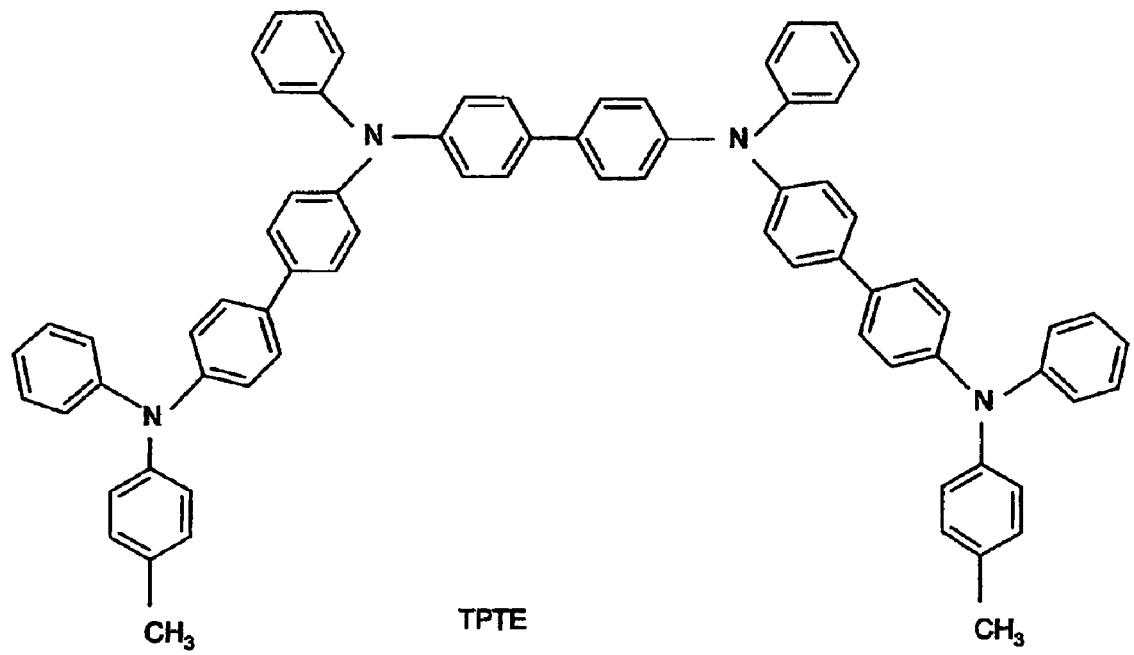
Figure 16A:
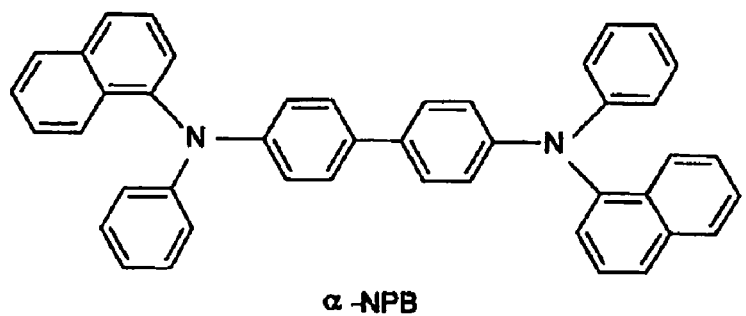
Figure 16B:
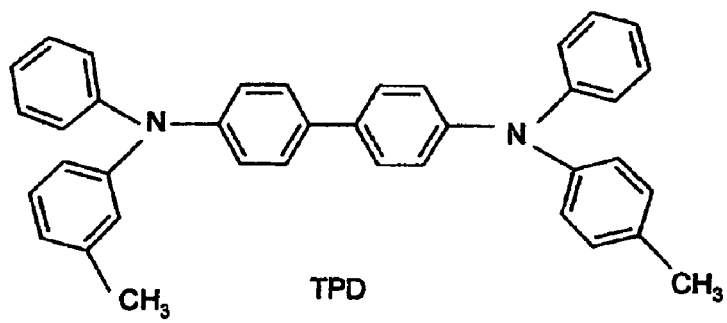
Figure 16C:
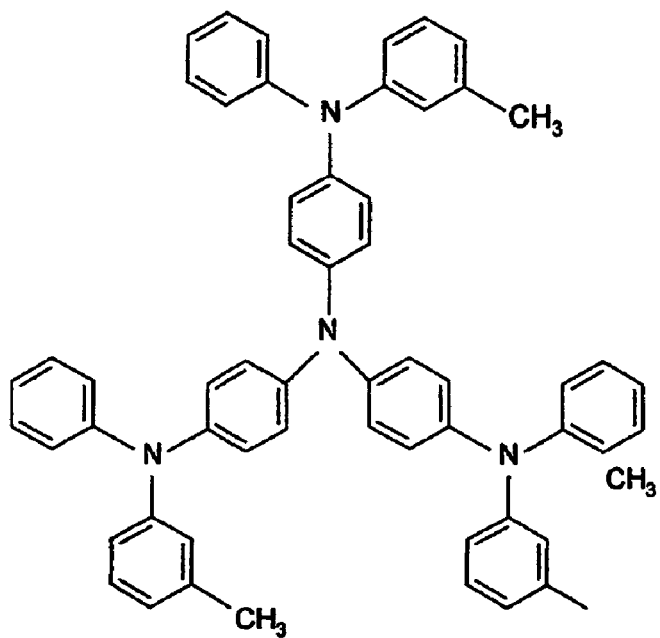

Optionally there is a layer of an electron transmitting material between the cathode and the electroluminescent material layer, the electron transmitting material is a material which will transport electrons when an electric current is passed through electron transmitting materials include a metal complex such as a metal quinolate e.g. an aluminium quinolate, lithium quinolate a cyano anthracene such as 9,10 dicyano anthracene, a polystyrene sulphonate and compounds of formulae shown in FIGS. 9 and 10. Instead of being a separate layer the electron transmitting material can be mixed with the electroluminescent material and co-deposited with it.

In general the thickness of the layers is from 5 nm to 500 nm.

The second electrode functions as the cathode and can be any low work function metal e.g. aluminium, calcium, lithium, silver/magnesium alloys etc., aluminium is a preferred metal. Lithium fluoride can be used as the second electrode for example by having a lithium fluoride layer formed on a metal.

The hole transporting material can optionally be mixed with the electroluminescent material in a ratio of 5-95% of the electroluminescent material to 95 to 5% of the hole transporting compound.

The hole transporting materials, the electroluminescent material and the electron injecting materials can be mixed together to form one layer, which simplifies the construction.

The electroluminescent material can be deposited on the substrate directly by evaporation from a solution of the material in an organic solvent. The solvent which is used will depend on the material but chlorinated hydrocarbons such as dichloromethane, n-methylpyrrolidone, dimethyl sulphoxide, tetra hydrofuran dimethylformamide etc. are suitable in many cases.

Alternatively the material can be deposited by spin coating from solution or by vacuum deposition from the solid state e.g. by sputtering or any other conventional method can be used.

The invention is illustrated in the following examples in which Examples 1 to 9 show the synthesis of the ligands

EXAMPLE 1

Methylene-bis(diphenylphospbane oxide)

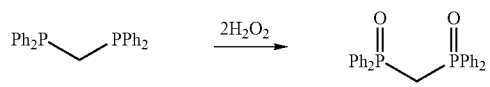

To a solution of Bis(diphenylphospbino)methane (2.0 g, 5.2 mmol, Sigma-Aldrich) in 50 mL ethanol was added 2 drops of 0.5M sodium hydroxide solution. Hydrogen peroxide (2.4 mL 30% wt solution, 21.0 mmol. BDH) was introduced dropwise over 1 minute, the reaction cooled to 5° C. and stored for 3 hours. Heating to 60° C. afforded complete dissolution of the white precipitate. Addition of deionised water until the cloud-point, followed by storage at 5° C. for 12 hours yielded 2.0 g (92%) of the desired product (colourless crystals), mp. 182-3° C.

Anal. Cald. for $C_{25}H_{22}O_2P_2$: C, 72.11; H, 5.33.

EXAMPLE 2

Ethylene-1,2-bis(diphenylphosphane oxide)

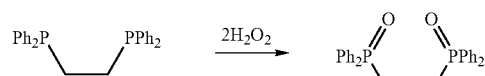

To a solution of 1,2-Bis(diphenylphosphino)ethane (2.0 g. 5.0 mmol, Sigma-Aldrich) in 50 mL ethanol was added 2 drops of 0.5M sodium hydroxide solution. Hydrogen peroxide (2.3 mL 30% wt solution, 20.0 mmol, BDH) was introduced dropwise over 1 minute, the reaction cooled to 5° C. and stored for 3 hours. Heating to 60° C. afforded complete dissolution of the white precipitate. Addition of deionised water until the cloud-point, followed by storage at 5° C. for 12 hours yielded 1.95 g (90%) of the desired product (colourless crystals), mp. 271-3° C.

Anal. Cald. for $C_{26}H_{24}O_2P_2$: C, 72.55; H, 5.62; P, 14.39.

EXAMPLE 3

Butylene-1,4-bis(diphenylphospane oxide)

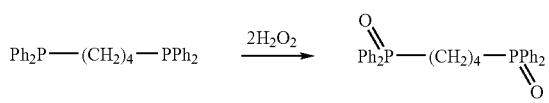

To a solution of 1,4-Bis(diphenylphosphino)butane (2.0 g. 4.7 mmol, Sigma-Aldrich) in 50 mL ethanol was added 2 drops of 0.5M sodium hydroxide solution. Hydrogen peroxide (2.3 mL 30% wt solution, 20.0 mmol, BDH) was introduced dropwise over 1 minute, the reaction cooled to 5° C. and stored for 3 hours. Heating to 60° C. afforded complete dissolution of the white precipitate. Addition of deionised water until the cloud-point, followed by storage at 5° C. for 12 hours yielded 1.80 g (84%) of the desired product (colourless crystals), m.p. 145° C.

Anal. Cald. for $C_{28}H_{28}O_2P_2$: C, 73.35; H. 6.16

EXAMPLE 4

Ethylene-1,4-bis(dipyridylphosphane oxide)

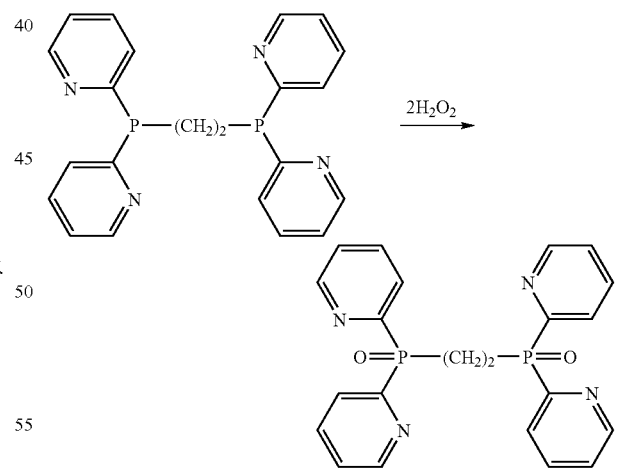

To a solution of 1,2-Bis(dipyridylphosphino)ethane (0.5 g, 1.24 mmol) in 50 mL ethanol was added 2 drops of 0.5M sodium hydroxide solution. Hydrogen peroxide (0.5 mL 30% wt solution, 5 mmol, BDH) was introduced dropwise over 1 minute, the reaction cooled to 5° C. and stored for 3 hours. Heating to 60° C. afforded complete dissolution of the white precipitate. The product (0.5 g. 93%) was recrystallised from methanol/water.

Anal. Cald. for $C_{22}H_{20}N_4O_2P_2$:C, 60.83; H4.64; N, 12.80

EXAMPLE 5

Bis(2-diphenylphosphane oxide-ethyl)phenylphosphane oxide

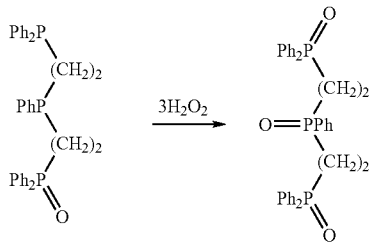

To a solution of Bis(2-diphenylphosphinoethyl)phenylphosphane (2.0 g. 3.74 mmol, Sigma-Aldrich) in 80 mL ethanol was added 2 drops of 0.5M sodium hydroxide solution. Hydrogen peroxide (2.5 mL 30% wt solution, 22.0 mmol, BDH) was introduced dropwise over 1 minute, the reaction cooled to 5° C. and stored for 3 hours. Heating to 60° C. afforded complete dissolution of the white precipitate. Addition of deionised water until the cloud-point, followed by storage at 5° C. for 12 hours yielded 1.90 g (90%) of the desired product (colourless crystals), mp. 304-5° C.

Anal. Cd. for $C_{34}H_{33}O_3P_3$: C, 70.10; H, 5.71.

EXAMPLE 6

Methylene-bis(diphenylphosphinimino-phosphane oxide)

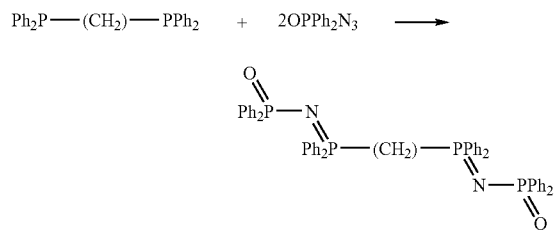

Diethylether (50 mL, dried and distilled over sodium) was added to Bis(diphenylphosphino)methane (2.0 g. 5.2 mmol, Sigma-Aldrich in a three-necked flask equipped with condenser, pressure-equalising dropping funel and under a nitrogen atmosphere. Diphenylazidophosphane (2.78 g, 11.0 mmol) in dry diethylether (100 mL) was added dropwise over 15 minutes to the suspension. A further 50 mL diethylether was used to rinse the pressure-equalising dropping funnel, which was subsequently removed and the reaction refluxed for 3 hours. After stirring for 15 hours at room temperature, a white precipitate (3.0 g. 71%) was filtered and washed with diethylether. Recrystallisation from toluene/hexane yielded an analytically pure sample, m.p. 208-9° C. Anal. Cald. for $C_{49}H_{42}N_2O_2P_4$: C, 72.23; H, 5.20; N, 3.44.

EXAMPLE 7

Ethylene-1,2-bis(diphenylphosphinimino-phosphane oxide)

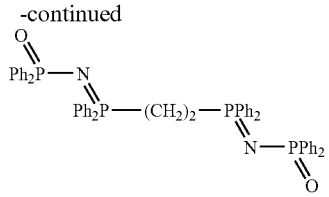

Diethylether (50 mL, dried and distilled over sodium) was added to 1,2-Bis(diphenylphosphinoethane (4.0 g, 10.0 mmol, Sigma-Aldrich) in a three-necked flask equipped with condenser, pressure-equalising dropping funnel and under a nitrogen atmosphere. Diphenylazidophosphane (6.0 g. 25.0 mmol) in dry diethylether (100 mL) was added dropwise over 15 minutes to the suspension. A further 50 mL diethylether was used to rinse the pressure-equalising dropping funnel, which was subsequently removed and the reaction refluxed for 3 hours. After stirring for 15 hours at room temperature, a white precipitate (7.95 g, 96%) was filtered and washed with diethylether. Recrystallisation from ethanol/water yielded an analytically pure sample, m.p. 230° C. Anal. Cald. for $C_{50}H_{44}N_2O_2P_4$: C, 72.46; H, 5.35; N, 3.38; P, 14.95.

EXAMPLE 8

Butylene-1,4-bis(diphenylphosphinimo-phosphane oxide)

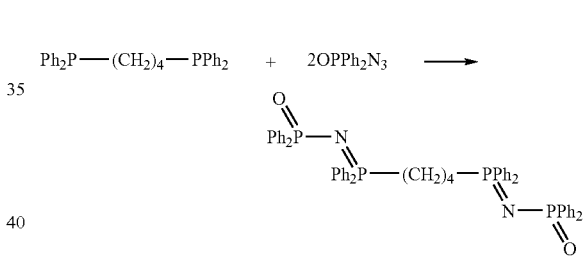

Diethylether (50 mL, dried and distilled over sodium) was added to 1,4-Bis(diphenylphosphino)butane (2.5 g 5.86 mmol, Sigma-Aldrich) in a three-necked flask equipped with condenser, pressure-equalising dropping funnel and under a nitrogen atmosphere. Diphenylazidophosphane (2.71 g. 11.2 mmol) in dry diethylether (50 mL) was added dropwise over 15 minutes to the suspension. A further 50 mL diethylether was used to rinse the pressure-equalising dropping funnel, which was subsequently removed and the reaction refluxed for 3 hours. After stirring for 15 hours at room temperature, a white precipitate (4.27 g, 85%) was filtered and washed with diethylether. Recrystallisation from toluene/hexane yielded an analytically pure sample, m.p. 206-7° C. Anal. Cald. for $C_{52}H_{48}N_2O_2P_4$: C, 72.89; H, 5.65; N, 3.27.

EXAMPLE 9

Hexylene-1,6-bis(diphenylphosphinimino-phosphane oxide)

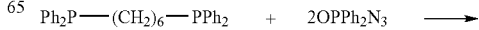

-continued

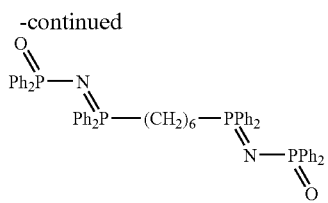

Diethylether (50 mL, dried and distilled over sodium) was added to 1,6-Bis(diphenylphosphino)hexane (2.5 g, 5.5 mmol. Sigma-Aldrich) in a three-necked flask equipped with condenser, pressure-equalising dropping funnel and under a nitrogen atmosphere. Diphenylazidophosphane (2.56 g, 10.Smmol) in dry diethylether (50 mL) was added dropwise over 15 minutes to the suspension. A further 50 mL diethylether was used to rinse the pressure-equalising dropping funnel, which was subsequently removed and the reaction refluxed for 3 hours. After stirring for 15 hours at room temperature, a white precipitate (3.3 g, 68%) was filtered and washed with diethylether. Recrystallisalion from toluene/hexane yielded an analytically pure sample, m.p. 245° C. Anal. Cald. for $C_{54}H_{52}N_2O_2P_4$: C, 73.29; H. 5.92; N, 3.16.

EXAMPLE 10

Methylene-bis(diphenylphosphane oxide)bis-[terbium tri(tetramethylheptanedione)

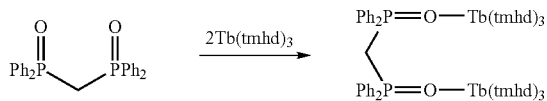

1.18 g (2.83 mmol) of Methylene-bis(diphenylphosphane oxide) and 4.0 g (5.66 mmol)

Terbium tris(tetramethylheptanedione) were dissolved in 80 mL chloroform. The solution was heated for 1 hour and the solvent removed under vacuum to yield an oily residue. Addition of acetonitrile gave a white precipitate (4.0 g. 77%), which was filtered, washed with further acetonitrile and dried under vacuum at 80° C., mp. 195° C.

Anal. Cald. for $C_{91}H_{136}O_{14}P_2Tb_2$:C, 59.60; H, 7.48;P, 3.38.

Photoluminescence: $PL_{;eff.}$ :0.28 cd m$^{-2}$ μmW$^{-1}$ @630 μW; peak=548 nm CIE coordinates x: 0.32, y: 0.61.

EXAMPLE 11

Butylene-bis(diphenylphosphane oxide)bis[terbium tris(tetramethylheptanedione)]

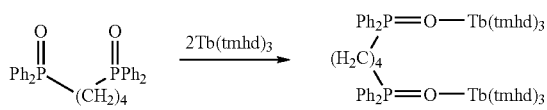

0.50 g (1.09 mmol) of Butylene-bis(diphenylphosphane oxide) and 1.55 g (2.18 mmol) Terbium tris(tetramethylheptanedione) were dissolved in 80 mL chloroform. The solution was heated for 1 hour and the solvent removed under vacuum to yield an oily residue. Addition of acetonitrile gave a white precipitate (3.0 g, 94%), which was filtered, washed with further acetonitrile and dried under vacuum at 80° C., m.p. 212° C. Anal. Cald. for $C_{94}H_{142}O_{14}P_2Tb_2$: C, 60.18; H 7.63; Tn, 16.04.

Photoluminescence:

$PL_{;eff.}$ :0.25 cd m$^{-2}$ μmW$^{-1}$ @870 μW; peak=545 nm CIE coordinates x: 0.31, y: 0.62. (Terbium tris(tetramethylheptanedione) was prepared from Tetramethylheptanedione, Terbium (III) chloride and Ammonium hydroxide. It is also available commercially.)

EXAMPLE 12

Butylene-bis(diphenylphosphane oxide)bis[europium tris(dibenzoylmethane)]

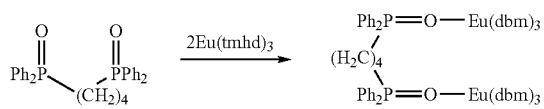

0.50 g (1.09 mmol) of Butylene-bis(diphenylphosphane oxide) and 1.79 g (2.18 mmol) Europium tris(dibenzoymethane) were dissolved in 80 mL chloroform The solution was heated for 1 hour and the solvent reduced under vacuum to approximately 2 mL. Petroleum ether (40-60° C.) was added until the cloud point, the reaction cooled to 5° C. and stored until a yellow precipitate had formed. This was filtered (2.1 g, 92%), washed with petroleum ether (40-60° C.) and dried under vacuum at 80° C., mp. 212° C.

Anal. Cald. for $C_{118}H_{94}O_{14}P_2Eu_2$:C, 67.43; H, 4.51 Photolumimscence:$PL_{;eff.}$ :0.12 cd m$^{-2}$ μmW$^{-1}$ @800 μW; peak=613 nm CIE coordinates x: 0.66, y: 0.33.

EXAMPLE 4

Ethylene-bis(dipyridylphosphane oxide)-bis[terbium tris(tetramethylheptanedione)]

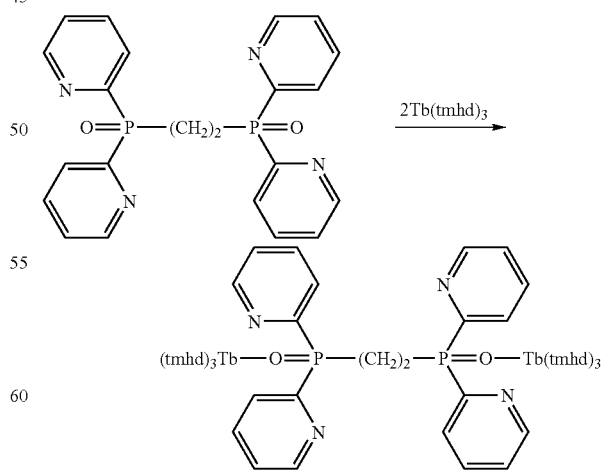

0.34 g (0.78 mmol) of Ethylene-bis(diphenylphosphane oxide) and 1.1 ig (1.57 mmol) Terbium tris(tetramethylheptanedione) were dissolved in 60 mL chloroform The solution was heated for 1 hour and the solvent removed under vacuum to yield an oily residue. Acetonitrile was added and the white precipitate was filtered and washed with further acetonitrile. This was recrystallised from toluene/hexane and dried under vacuum at 80° C. to give an analytically pure sample (1.2 g, 83%), m.p. 240-241.5° C.

Anal. Cald. for $C_{88}H_{134}N_4O_{14}P_2Tb_2$: C, 57.08; C, 56.97. Photoluminescence:$PL_{;eff}$ :0.26 cd m$^{-2}$ μmW$^{-1}$ @880 μW; peak=548 nm CIE coordinates x: 0.31, y: 0.62.

EXAMPLE 13

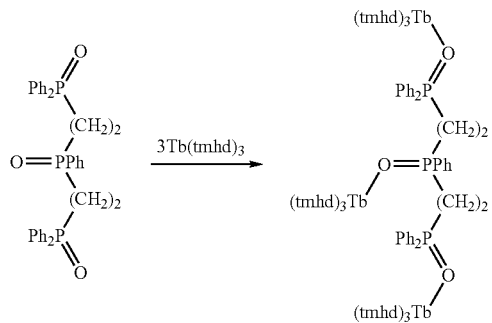

1.0 g (1.72 mmol) of Bis(2-diphenylphosphane oxide-ethyl)phenylphosphane oxide was dissolved dissolved in 80 mL chloroform 3.65 g (5.15 mmol) Terbium tris(tetramethylheptanedione) was dissolved in 120 miL acetonitrile. The two solutions were mixed at 60° C. and heated for 1 hour. The solvent reduced under vacuum to yield an oily residue. Acetonitrile was added to afford a white precipitate (3.9 g. 84%), which was collected and washed with further acetonitrile. An analytical sample was recrystallised from toluene/hexane and dried under vacuum at 80° C., nip. 202-6° C.

Anal Cald. for $C_{94}H_{142}O_{14}P_2Tb_2$: C, 60.18; H, 7.63; Th 16.95. Photoluminescence: $PL_{;eff}$ :0.27cd m$^{-2}$ μmW$^{-1}$ @880 μW; peak=548 mm CIE coordinates x: 0.31, y: 0.62.

EXAMPLE 14

Methylene-bis(diphenylphosphinimino-phosphane oxide)-bis~terbium tris(tetramethytheptanedione)]

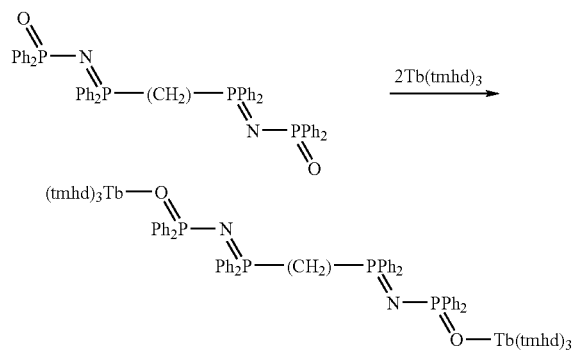

0.57 g (0.71 mmol) of Methylene-bis(diphenylphosphinimino-phosphane oxide) and 1.0 g (1.41 mmol) Terbium tris(tehramethylheptanedione) were dissolved in 80 mL chloroform. The solution was heated for 1 hour and the solvent removed under vacuum to yield an oily residue. Addition of acetonitrile gave a white precipitate (1.4 g. 89%), which was filtered, washed with further acetonitrile and dried under vacuum at 80° C., m.p. 275-7° C.

Anal. Cald. for $C_{115}H_{156}N_2O_{14}P_4Tb_2$: C, 61.88; H, 7.04; N, 1.25; P, 5.55; Tb, 14.94. Photoluminescence: $PL_{;eff}$ :0.28 cd m$^{-2}$ μmW$^{-1}$ @630 μW; peak=548 nm CIE coordinates x: 0.32, y: 0.61.

EXAMPLE 15

Ethylene-bis(diphenylphosphinimino-phosphane oxide)bis[terbium tris(tetramethylheptanedione)]

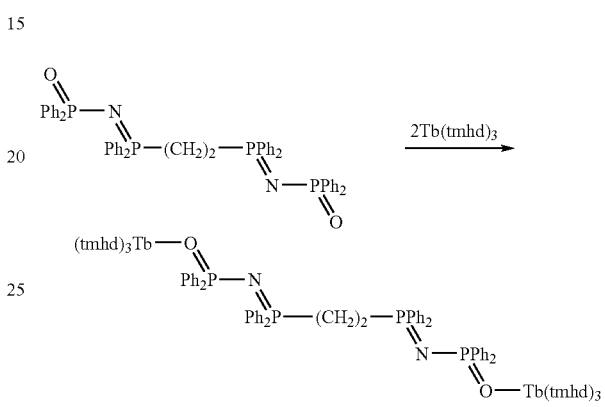

0.585 g (0.71 mmol) of Ethylene-bis(diphenylphosphinimino-phosphane oxide) and 1.0 g (1.41 mmol) Terbium tris(tetramethylheptanedione) were dissolved in 100 mL chloroform. The solution was heated for 1 hour and the solvent removed under vacuum to yield an oily residue. Addition of acetonitrile gave a white precipitate (1.4 g 88%), which was filtered, washed with further acetonitrile and dried under vacuum at 80° C., mp. 240-2° C.

Anal. Cald for for $C_{116}H_{158}N_2O_{14}P_4Tb_2$:C, 62.03; H, 7.09; N, 1.25; P, 5.52; Tb, 14.15. Photoluminescence: $PL_{;eff}$ : 0.23 cd m$^{-2}$ μmW$^{-1}$ @630 μW; peak=547 nm CIE coordinates x: 0.31, y 0.62.

EXAMPLE 16

Ethylene-bis(diphenylphosphinimino-phosphane oxide)-bis~europium tris(dibenzoyhnethane)]

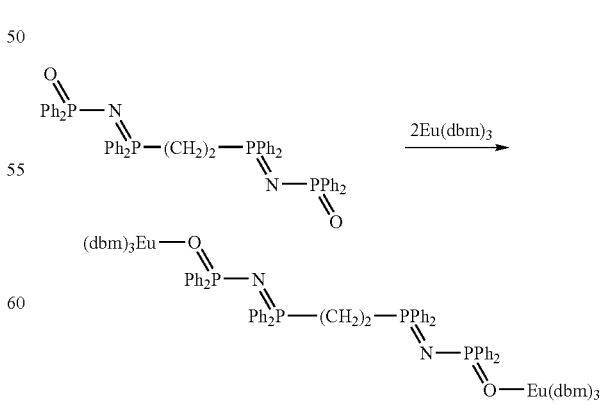

1.01 g (1.22 mmol) of Ethylene-bis(diphenylphosphinimino-phosphane oxide) and 2.0 g (2.43 mmol) Europium tris(dibenzoyhnethane) were dissolved in 50 mL dichloromethane. The solution was heated for 1 hour and the solvent removed under vacuum to yield an oily residue. Recrystallisation from toluene/petroleum ether (40-60° C.) afforded yellow/orange crystals (2.5 g, 83%), which were filtered, washed with further petroleum ether (40-60° C.) and dried under vacuum at 80° C., m.p. 236-8° C.

Anal for $C_{140}H_{110}N_2O_{14}P_4Eu_2$ C, 68.02; H. 4.48; N, 1.13; P, 5.01; Eu, 12.29. Photoluminescence: $PL_{;eff.}$:0.0.08 cd m$^{-2}$ μmW$^{-1}$ @820 μW; peak=612 nm CIE coordinates x: 0.66, y: 0.33.

EXAMPLE 17

Butylene-bis(diphenylphosphinimino-phosphane oxide)-bis~terbium tris(tetramethylheptanedione)]

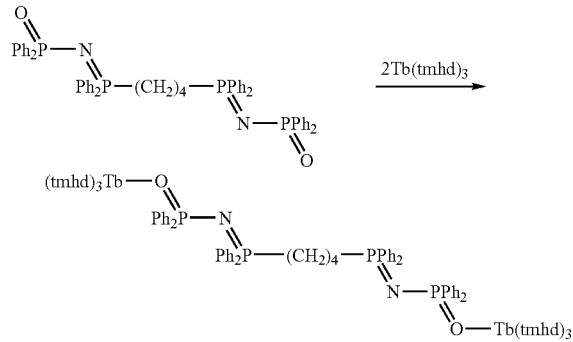

0.5 g (0.58 mmol) of Butylene-bis(diphenylphosphinimino-phosphane oxide) and 0.83 g (1.17 mmol) Terbium tris(tetramethytheptanedione) were dissolved in 80 mL chloroform. The solution was heated for 1 hour and the solvent removed under vacuum to yield an oily residue. Addition of acetonitrile gave a white precipitate (0.8 g. 60%), which was filtered, washed with further acetonitrile and dried under vacuum at 80° C., m.p. 248-250° C.

Anal Cald. for $C_{118}H_{162}N_2O_{14}P_4Tb_2$ C, 62.32; H, 7.18; N, 1.23; P, 5.45; Tb, 13.98.

EXAMPLE 18

Butylenebis(diphenylphosphinimno-phosphane oxide)-bis{europium tris~4,4,4-trifluoro-1-(2-naphthyl)-1,3~butanedione}}

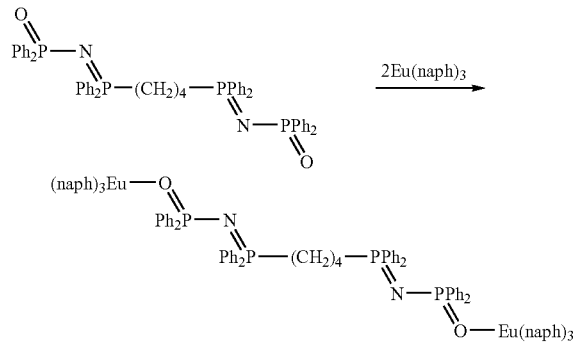

0.53 g (0.62 mmol) of Butylene-bis(diphenylphosphinimino-phosphane oxide) and 1.1 7 g (1.24 mmol) Europium tris~4,4,4-trifluoro-1-(2-naphthyl)-1,3-butanedione] were dissolved in 100 mL dichloromethane. The solution was heated for 1 hour and the solvent reduced to approximately 2 mL. Petroleum ether (40-60° C.) was added until the cloud point Storage at 5° C. for 3 hours yielded a yellow precipitate (1.0 g, 59%). This was filtered, washed with further petroleum ether (40-60° C.) and dried under vacuum at 80° C., m.p. 184° C. ($T_g$-82° C.).

Anal. Cald. for $C_{136}H_{96}N_2O_{14}F_{15}P_4Eu_2$:C, 59.36; H, 3.52; N, 1.02. Photoluminescence: $PL_{;eff.}$:0.0.08 cd m$^{-2}$ μmW$^{-1}$ @820 μW; peak=612 nm CIE coordinates x: 0.66, y: 0.33. (Europium tris~4,4,4-trifluoro-I-(2-naphthyl)-I,3-butanedione] was synthesised from Europium (III) chloride, 4,4,4-Trifluoro-1-(2-naphthyl)-1,3-butanedione (Fluorochem) and Ammonium hydroxide.)

EXAMPLE 19

Electroluminescent Device

Figure 21:
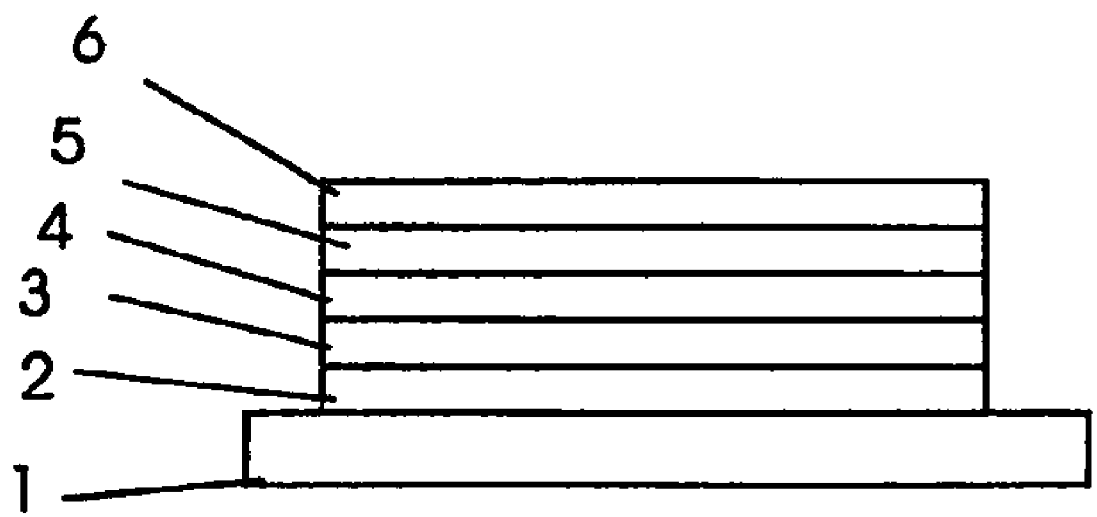
FIG. 21 is a diagram of an OLED in accordance with this invention.

An electroluminescent device was made by depositing sequentially from solution onto a indium tin oxide glass anode layers of DDPANI 8 nm; α-NPB; an electroluminescent layer comprising a compound made as in Example 14; aluminium quinolate and an aluminium cathode. The device is shown schematically in FIG. 21 where (1) is the ITO anode; (2) is a DDPANI layer; (3) is an α-NPB layer, (4) is the electroluminescent layer comprising a compound made as in Example 14; (5) is an aluminium quinolate layer and (6) is an aluminium cathode.

Figure 22:
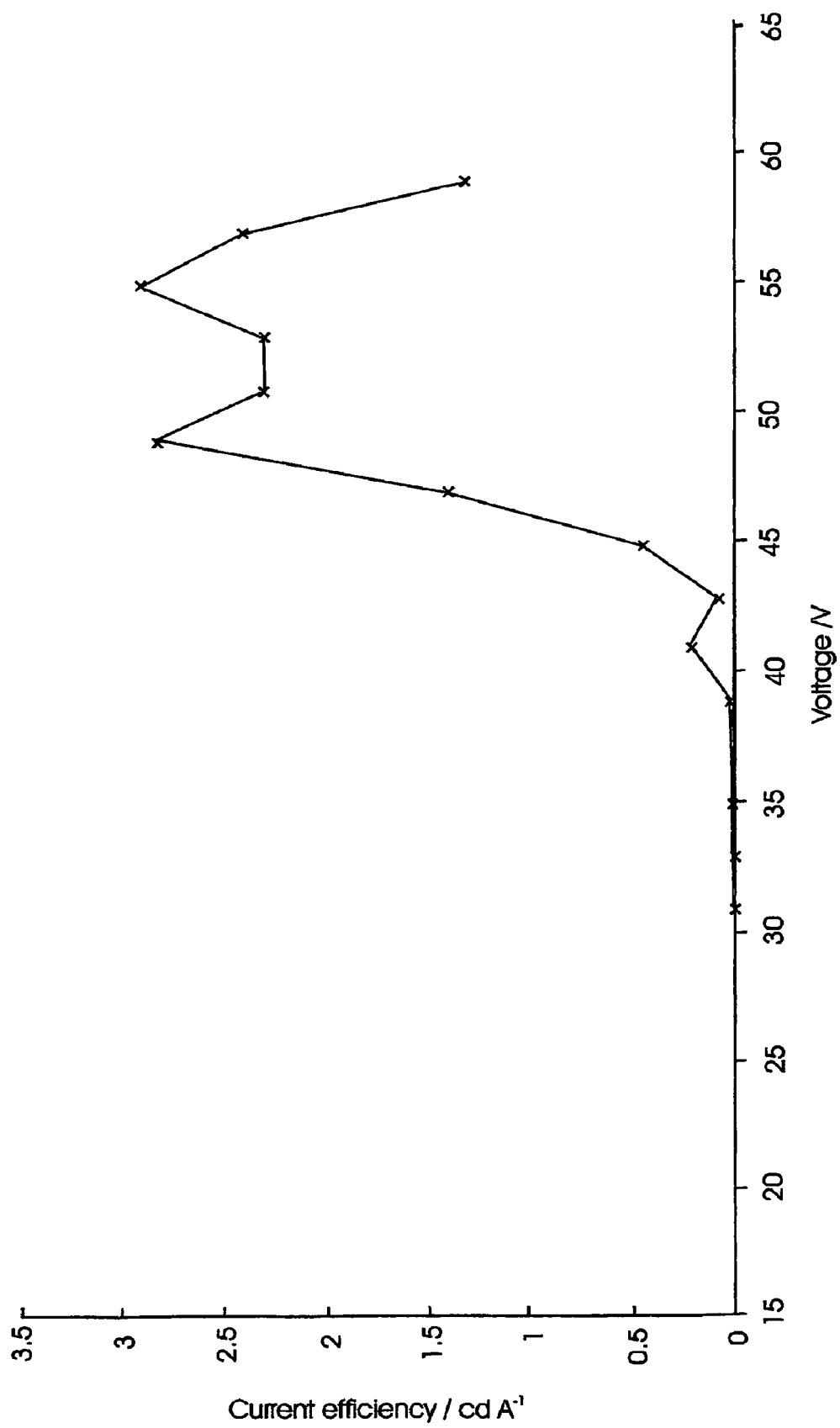
FIGS. 22 and 23 are graphs of current efficiency against voltage (FIG. 22) and brightness against voltage (FIG. 23) for an electroluminescent device as described in Example 19.
Figure 23:
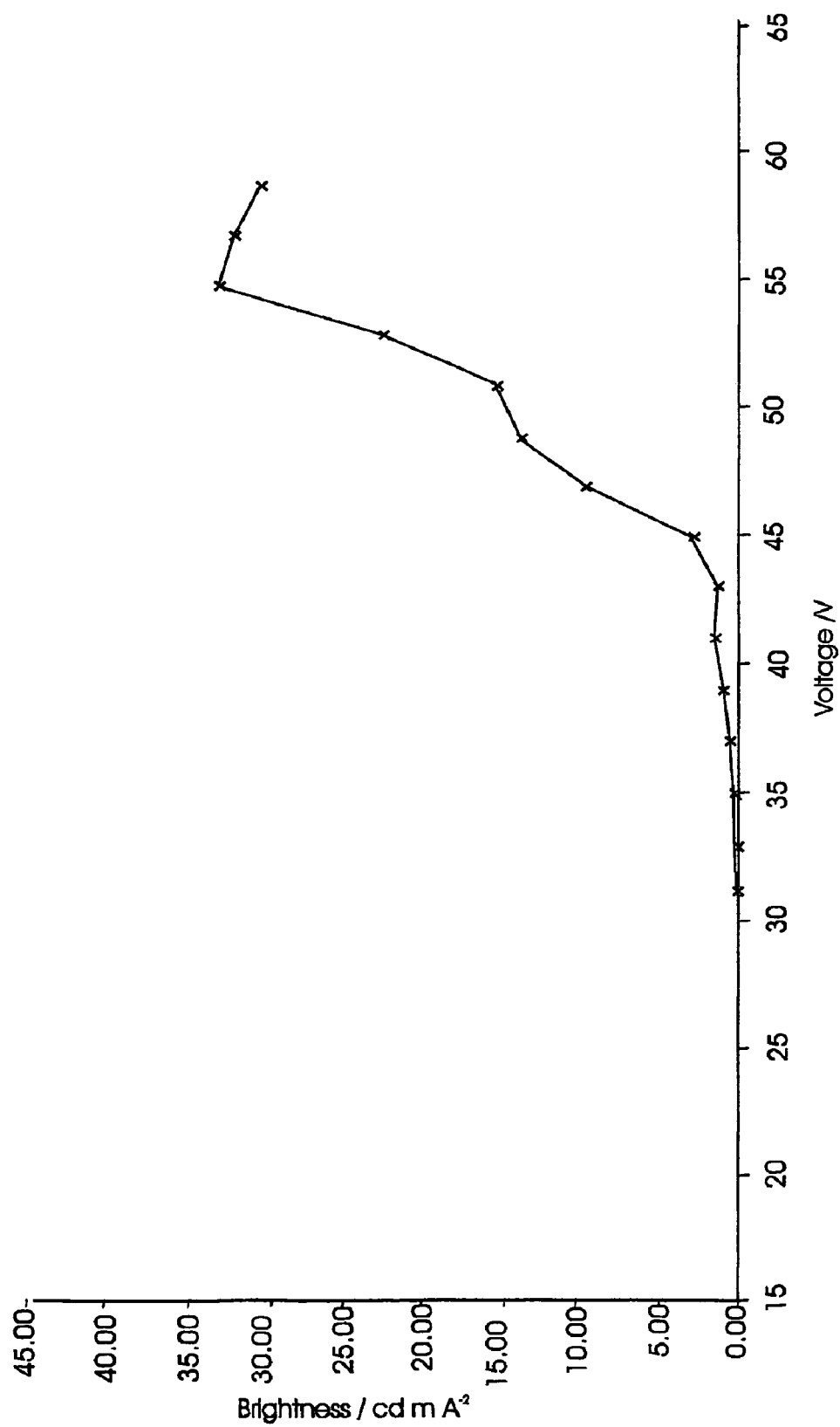

An electric current was passed between the aluminium cathode and ITO anode and the device emitted a green light with a peak wavelength $\lambda_{max}$ of 546 nm. The properties were measured and the results shown in FIGS. 22 and 23. Another device was made replacing the electroluminescent layer with a compound of formula as in Example 16, the device emitted a red length with a peak wavelength $\lambda_{max}$ of 611 nm.

The invention claimed is:

1. An electroluminescent device comprising a first electrode, a second electrode, and a layer comprising an electroluminescent compound between the first electrode and the second electrode wherein:
   the electroluminescent compound is selected from the group consisting of binuclear, trinuclear and polynuclear metal complexes in which nuclei are defined by at least two metal atoms, at least one of said metal atoms being selected from the group consisting of Sm (III), Eu (II), Eu (III), Tb (III), Dy(III), Yb (III), Lu (III), Gd (III), U(III), Tm (III), Ce (III), Pr (III), Nd (III), Pm (III), Dy (III), Ho (III), Er (III), and Yb (III), and at least a second of said metal atoms is selected from the group consisting of lithium, sodium, potassium, rubidium, cesium, beryllium, magnesium, calcium, strontium, barium, boron, aluminum, gallium, indium, germanium, tin, antimony, lead and metals of the first, second and third groups of transition metals;
   further wherein each metal atom is linked to another metal atom through a bridging ligand, said bridging ligands each having the general chemical formula:

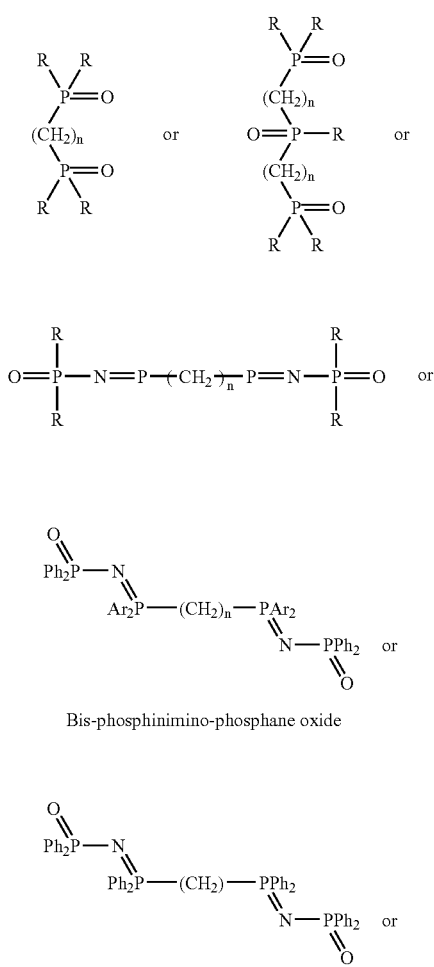

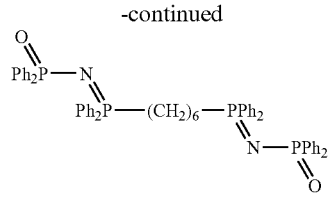

Bis-phosphinimino-phosphane oxide wherein: the groups R can be the same or different and are independently selected from the group consisting of hydrogen, substituted and unsubstituted aliphatic groups, substituted and unsubstituted aromatic, heterocyclic and polycyclic ring structures, fluorocarbon groups and halogen atoms; Ar represents a substituted or unsubstituted aromatic or heteroaromatic group; and further wherein n is an integer from 1 to 10.

2. The device of claim 1, wherein said at least one of said metal atoms is selected from the group consisting of Eu (III), Tb (III), Dy (III), and Gd(III).

3. The device of claim 1, further comprising a layer of a hole transmitting material located between an electrode that serves as an anode and the electroluminescent layer.

4. The device of claim 3, wherein the hole transmitting material is a film of a polymerized aromatic amine.

5. The device of claim 3, wherein the hole transmitting material is a film comprising a material selected from the group consisting of poly (vinylcarbazole), N,N'-diphenyl-N,N'-bis(3-methylphenyl)-1,1'-biphenyl-4,4'-diamine (TPD); polyaniline; substituted polyanilines; polythiophenes; substituted polythiophenes; polysilanes; and substituted polysilanes.

6. The device of claim 3, wherein the hole transmitting material is an aromatic amine selected from the group consisting of the following compounds:

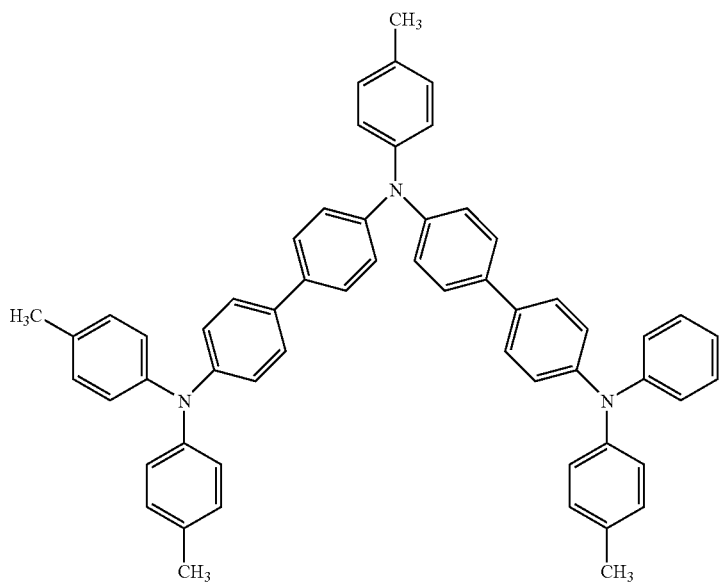

HTM-1

-continued

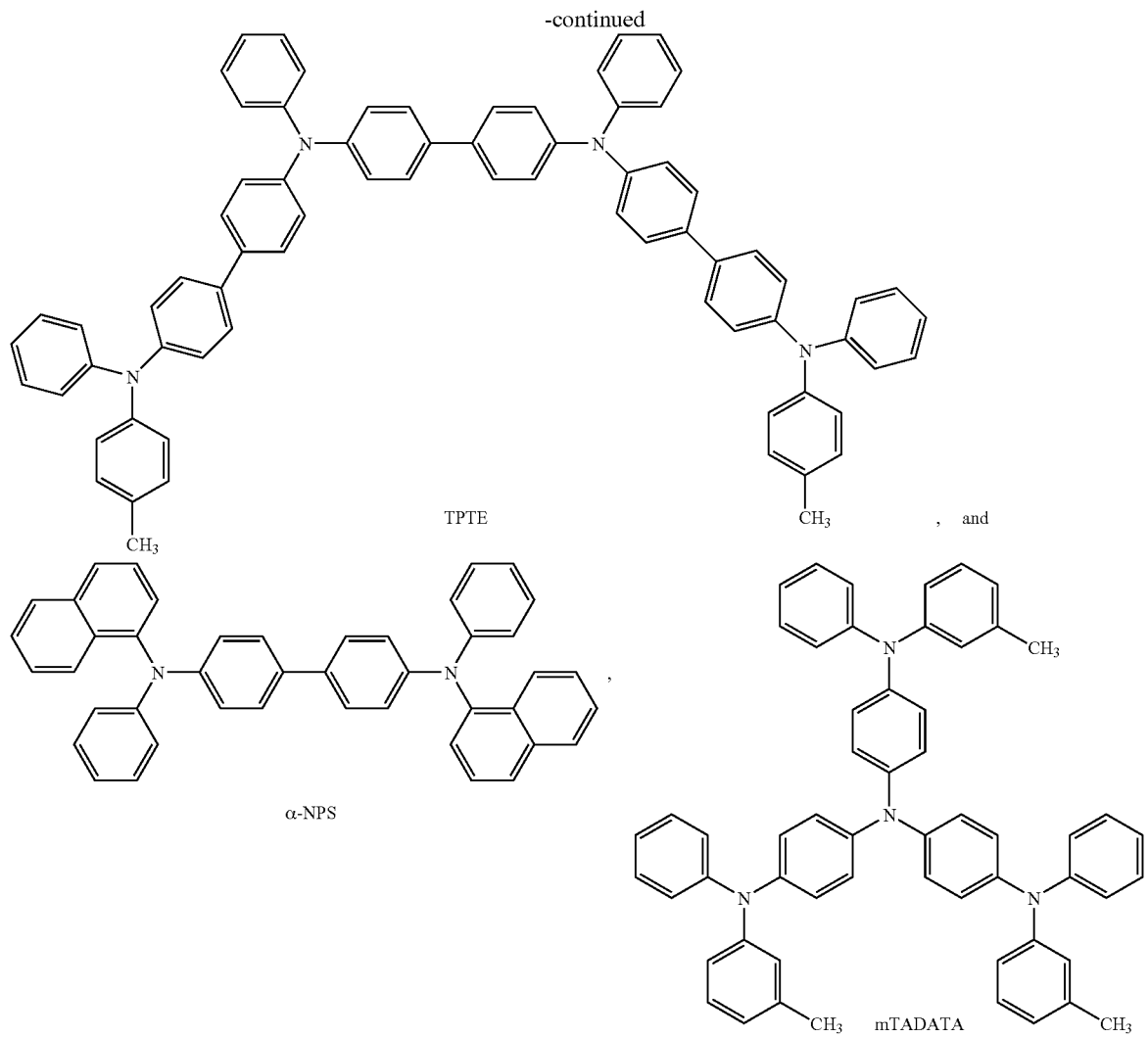

TPTE

α-NPS mTADATA

7. The device of claim 1, further comprising a layer of an electron transmitting material located between an electrode that serves as a cathode and the electroluminescent material layer.

8. The device of claim 7, wherein the electron transmitting material is a metal quinolate.

9. The device of claim 8, wherein the metal quinolate is aluminium quinolate or lithium quinolate.

10. The device of claim 9, wherein the electrode that serves as a cathode comprises a material selected from aluminium, calcium, lithium, and silver/magnesium alloys.

11. The device of claim 10, wherein a lithium fluoride layer is formed on the electrode that serves as a cathode, said lithium fluoride layer being located between the cathode and the electron transmitting material.

12. The device of claim 1, wherein each bridging ligand is selected from the group consisting of one of the following chemical formulas in which Ar represents a substituted or unsubstituted aromatic or heteromatic group:

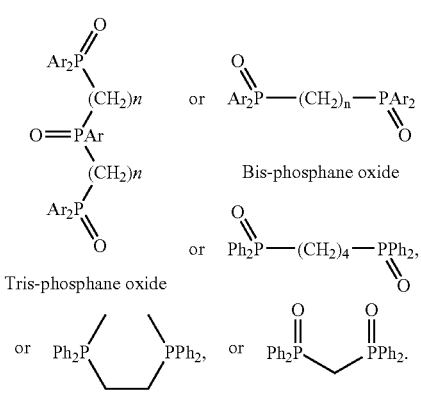

* * * * *